(12) United States Patent
Wang

(10) Patent No.: US 7,385,239 B2
(45) Date of Patent: Jun. 10, 2008

(54) SEMICONDUCTOR DEVICE AND MANUFACTURING METHOD THEREFOR

(75) Inventor: Wensheng Wang, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/496,639

(22) Filed: Aug. 1, 2006

(65) Prior Publication Data

US 2006/0273367 A1 Dec. 7, 2006

Related U.S. Application Data

(63) Continuation of application No. PCT/JP2004/007387, filed on May 28, 2004.

(51) Int. Cl.
*H01L 27/108* (2006.01)
(52) U.S. Cl. .......................... 257/295; 438/3
(58) Field of Classification Search ............... 257/295; 438/3
See application file for complete search history.

(56) References Cited

U.S. PATENT DOCUMENTS

| 5,625,529 | A | 4/1997 | Lee et al. | |
|---|---|---|---|---|
| 7,187,025 | B2 * | 3/2007 | Hamada et al. | ............. 257/295 |

FOREIGN PATENT DOCUMENTS

| CN | 1610116 A | 4/2005 |
|---|---|---|
| JP | 7-58222 A | 3/1995 |
| JP | 8-273436 A | 10/1996 |
| JP | 2001-139313 A | 5/2001 |
| JP | 2002-151656 A | 5/2002 |
| JP | 2003-2647 A | 1/2003 |

OTHER PUBLICATIONS

Y.Y. Yao et al., "Doping effect on the dielectric property in bismuth titanate", Journal of Applied Physics, Mar. 15, 2004, vol. 95, No. 6, pp. 3126 to 3130.
Woo Sik Kim et al., "The effects of cation-substitution on the ferroelectric properties of sol-gel derived PZT thin film for FRAM application", Thin Solid Films, Nov. 1999, vol. 335 to 356, pp. 531 to 535.
Katsuhiro Aoki et al., "The effects of La and Nb Modification on Fatigue and Retention Properties of Pb (Ti, Zr) $O_3$ Thin-Film Capacitors", Jpn. J. Appl. Phys., part 2, Sep. 15, 1997, vol. 36, No. 9A/9B, pp. L1195 to L1197.
Interantional Search Report of PCT/JP2004/007387 date of mailing Aug. 31, 2004.
Office Action dated Sep. 28, 2007, issued in corresponding Chinese Application No. 2004 80041890.5.

* cited by examiner

*Primary Examiner*—Douglas M Menz
(74) *Attorney, Agent, or Firm*—Westerman, Hattori, Daniels & Adrian, LLP.

(57) ABSTRACT

A ferroelectric capacitor having a bottom electrode (9a), a ferroelectric film (10a) and a top electrode (11a) is formed above a semiconductor substrate (1). The ferroelectric film (10a) is constituted of CSPZT with 0.1-5 mol % of La and 0.1-5 mol % of Nb.

20 Claims, 25 Drawing Sheets

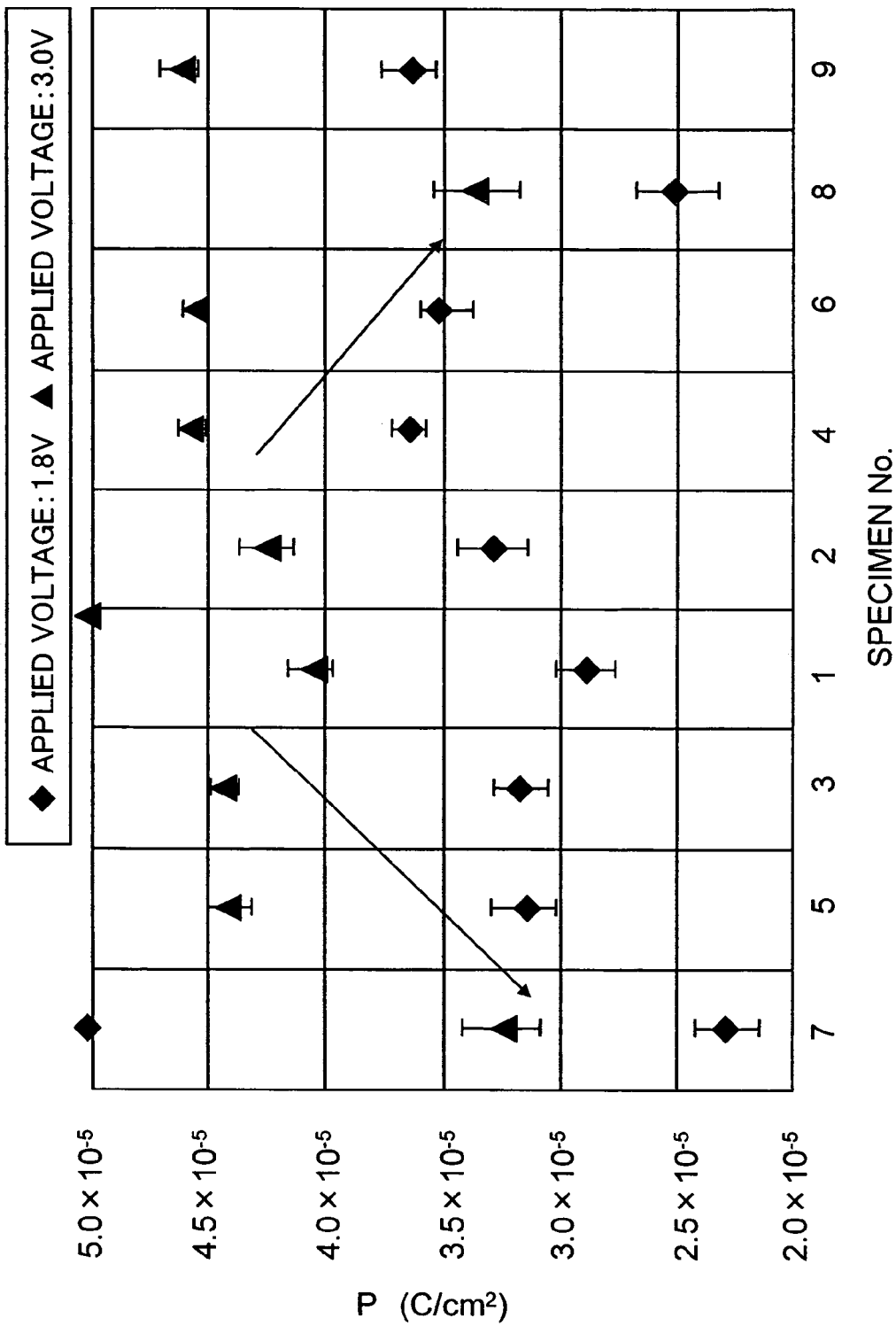

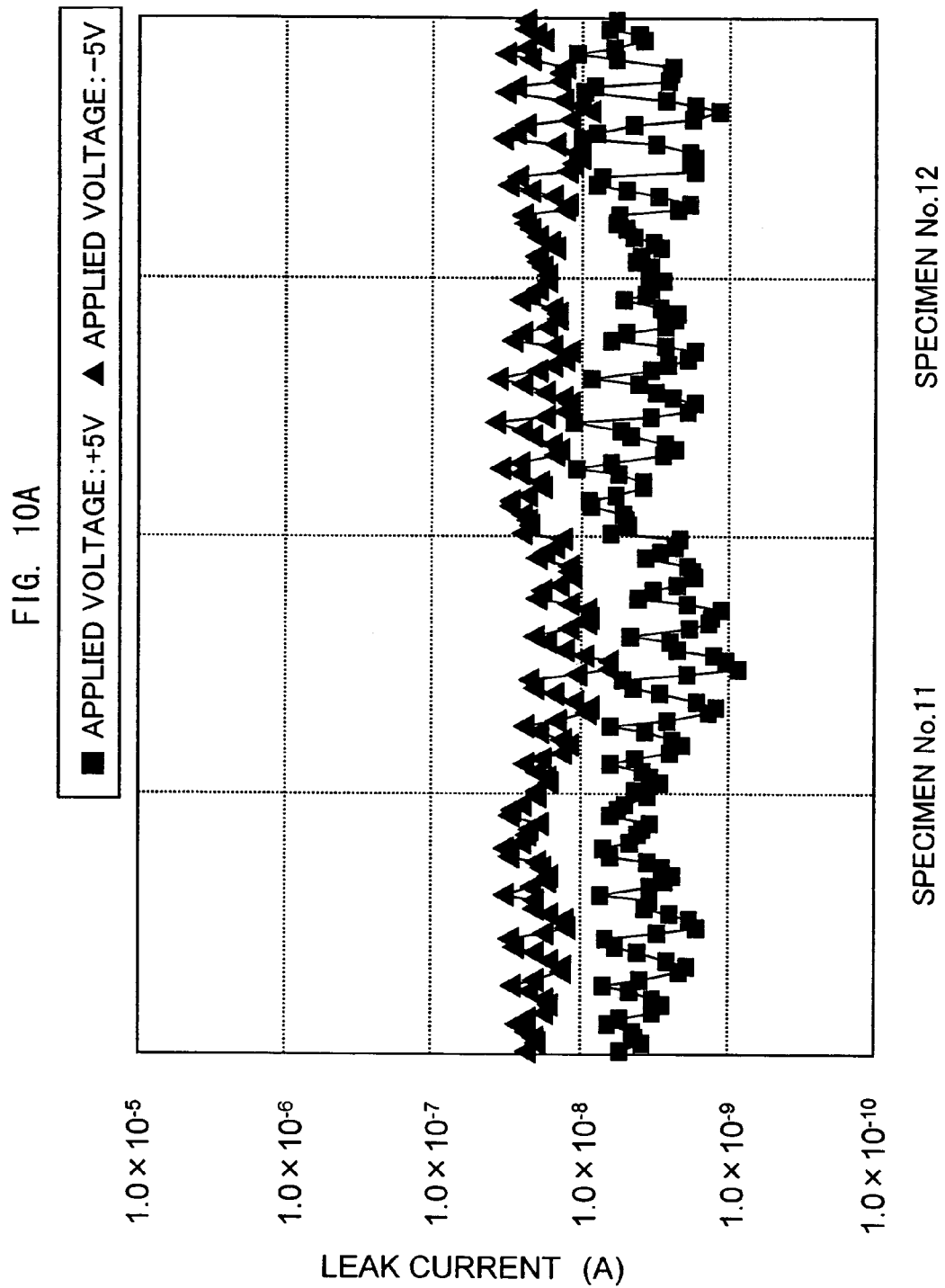

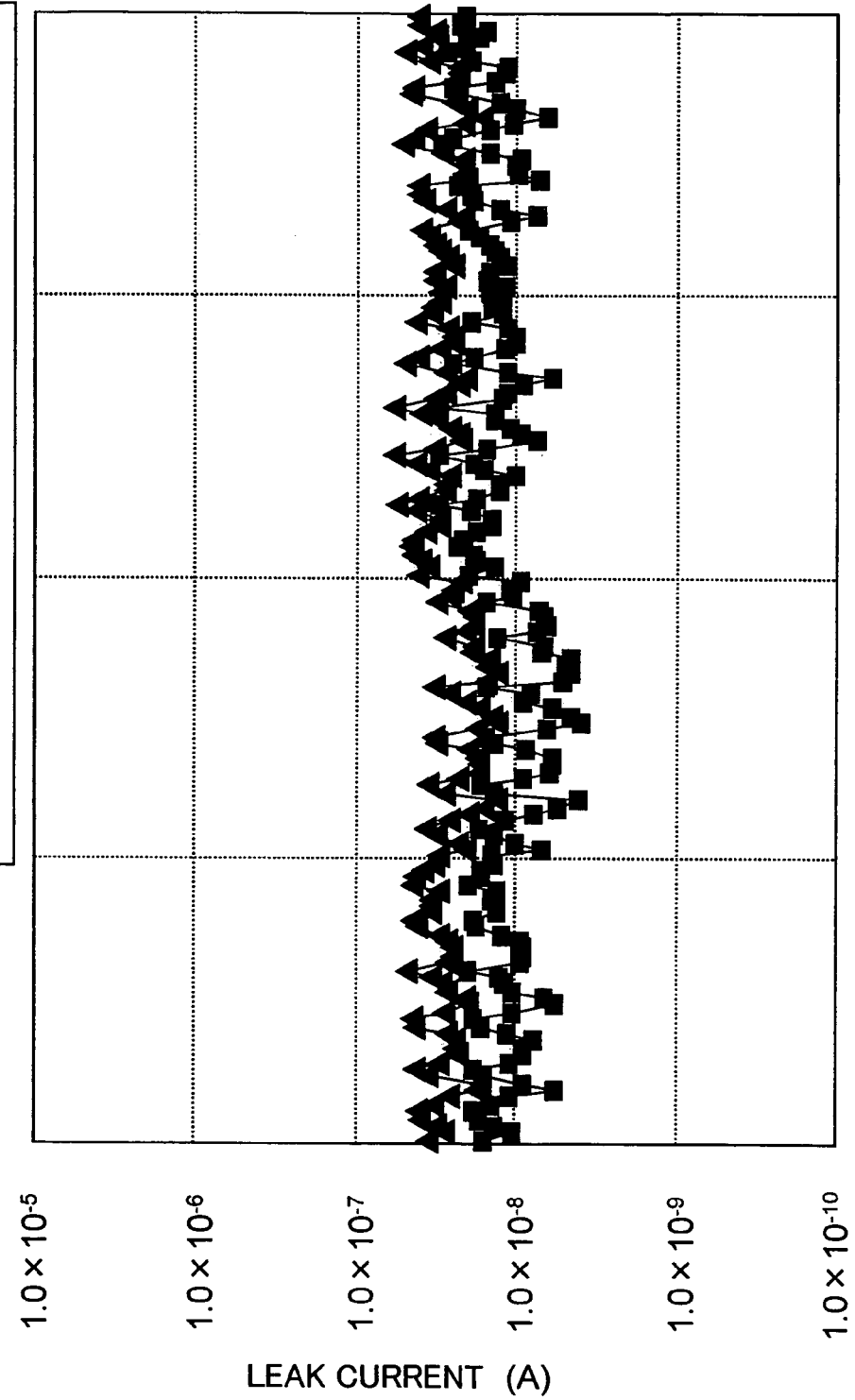

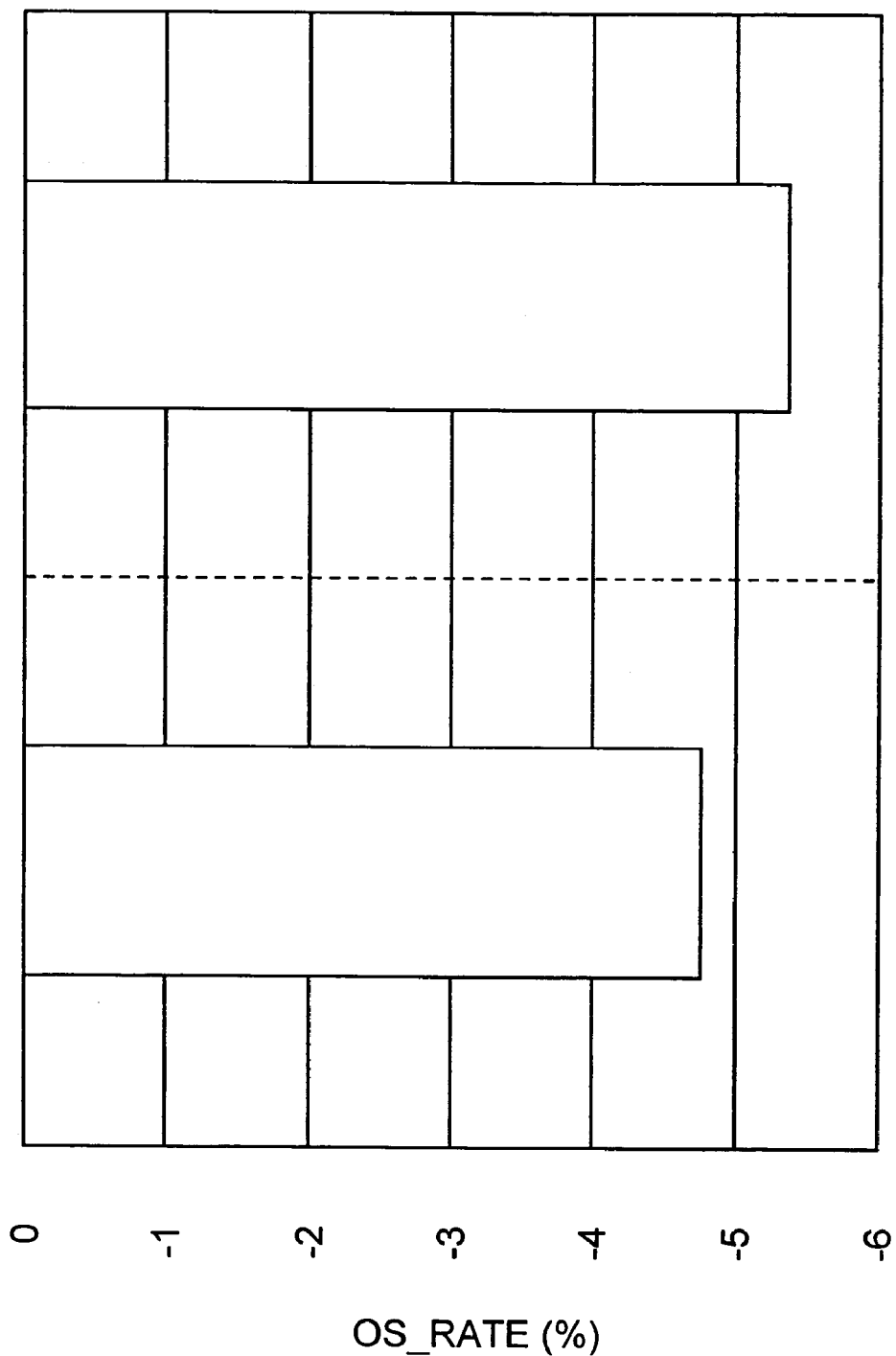

SEMICONDUCTOR DEVICE AND MANUFACTURING METHOD THEREFOR

TECHNICAL FIELD

The present invention relates to a semiconductor device suitable for a nonvolatile memory having a ferroelectric capacitor, and a manufacturing method therefor.

BACKGROUND ART

With the development of digital technologies, there is an increasing trend of high-speed processing or preservation of a large capacity data. Because of this, large-scale integration and high performance are required in semiconductor devices for use in electronic equipments.

Accordingly, to realize large-scale integration of a semiconductor memory device (DRAM), extensive studies and development are carried out on the techniques using a ferroelectric material or a high-permittivity material, in place of a silicon oxide or a silicon nitride, as a capacitor insulating film for a capacitance element constituting the DRAM.

Also, to realize a nonvolatile RAM capable of performing high-speed write/read operation at a low voltage, studies and development are being conducted actively in regard to a ferroelectric memory (FeRAM) using a ferroelectric film having a spontaneous polarization characteristic, as a capacitor insulating film.

The ferroelectric memory (FeRAM) stores information utilizing a hysteresis characteristic of a ferroelectric substance. The ferroelectric memory includes in each memory cell a ferroelectric capacitor having a ferroelectric film, as a capacitor dielectric film disposed between a pair of electrodes. In the ferroelectric substance, polarization occurs depending on a voltage applied between the electrodes, and spontaneous polarization remains even after the applied voltage is removed. Also, when the polarity of the applied voltage is reversed, the polarity of the spontaneous polarization is also reversed. Therefore, information can be read out by detecting the spontaneous polarization. Further, as compared with a flash memory, the ferroelectric memory is operable at a low voltage, and capable of high-speed writing with reduced power.

The ferroelectric film of the ferroelectric capacitor is formed of a PZT-based material, such as lead zirconate titanate (PZT) and La-doped PZT (PLZT), a compound having a bismuth layer structured ferroelectrics, such as $SrBi_2Ta_2O_9$ (SBT,Y1) and $SrBi_2(Ta,Nb)_2O_9$ (SBTN,YZ) Conventionally, as a film-forming method of the ferroelectric film, there has been used a sol-gel method, a sputtering method or an MOCVD method. By means of such the film-forming method, a ferroelectric film of an amorphous phase is formed on a bottom electrode film, and thereafter, the ferroelectric film is crystallized to a crystal of perovskite structure by a thermal treatment. A crystallinity of the ferroelectric film is subject to a crystallinity of the bottom electrode film, the film-forming condition and the crystallization condition of the ferroelectric film, and the like. Therefore, conventionally, by adjusting such the conditions, it has been intended to improve the crystallinity of the ferroelectric film. However, in recent years, it has become unable to satisfy the requirements of further improvement on the crystallinity. As a result, a ferroelectric capacitor having sufficient characteristics cannot be obtained any more, nor variation in the performance of the memory cell in an identical chip can be suppressed sufficiently.

Also, for example, in Patent document 1 (Japanese Patent Application Laid-open No. 2003-2647), there is disclosed the adoption of a variety of compositions of ferroelectric films for the purpose of decreasing a crystallization temperature of the ferroelectric film. However, there is no such method that can obtain sufficient crystallinity.

Patent document 1: Japanese Patent Application Laid-open No. 2003-2647

SUMMARY OF THE INVENTION

It is an object of the present invention to provide a semiconductor device and a manufacturing method therefor, capable of obtaining a more uniform and better characteristic.

The present invention is aimed at a semiconductor device including a semiconductor substrate and a ferroelectric capacitor with a ferroelectric film formed above the semiconductor substrate. According to the present invention, the ferroelectric film is constituted of a substance of which chemical formula is expressed by $ABO_3$, added with La and Nb.

Also, in a manufacturing method of a semiconductor device according to the present invention, a ferroelectric capacitor with a ferroelectric film is formed above a semiconductor substrate. At this time, a film is formed as the ferroelectric film, which film is constituted of a substance of which chemical formula is expressed by $ABO_3$, added with La and Nb.

BRIEF DESCRIPTION OF THE DRAWINGS

FIG. 5A shows a graph illustrating an examination result of a value P.

FIG. 10A shows a graph illustrating an examination result of a leak current (discrete).

FIG. 10B shows a graph illustrating a examination result of a leak current (memory cell array).

FIG. 14B shows a graph illustrating an OS_RATE.

DETAILED DESCRIPTION OF THE PREFERRED EMBODIMENTS

Figure 1:
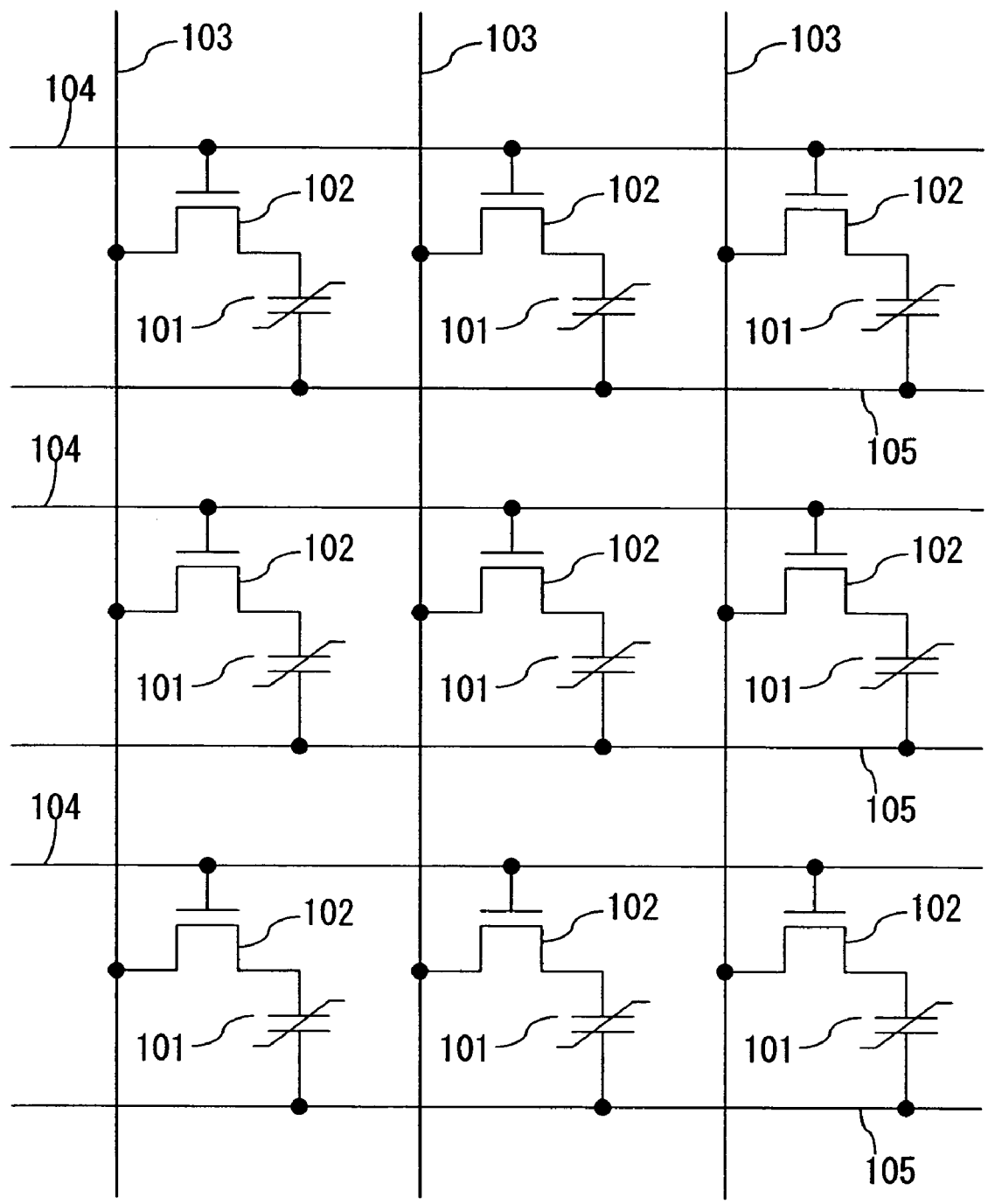
FIG. 1 shows a circuit diagram showing a memory cell array structure of a ferroelectric memory (semiconductor device) to be manufactured by a method according to an embodiment of the present invention.

Hereinafter, an embodiment of the present invention will be described concretely, referring to the accompanying drawings. FIG. 1 is a circuit diagram showing a memory cell array structure of a ferroelectric memory (semiconductor device) to be manufactured by a method according to the embodiment of the present invention.

In the memory cell array, there are provided a plurality of bit lines 103 extending in one direction, a plurality of word lines 104 and plate lines 105 extending in the direction perpendicular to the extending direction of the bit lines 103. Also, a plurality of memory cells of the ferroelectric memory according to the present embodiment is disposed in an array form so as to be matched with a grid consisting of the bit lines 103, word lines 104 and plate lines 105. In each memory cell, a ferroelectric capacitor (memory portion) 101 and a MOS transistor (switching portion) 102 are provided.

The gate of the MOS transistor 102 is connected to the word line 104. Also, one of the source and drain of the MOS transistor 102 is connected to the bit line 103, while the other of the source and drain is connected to one electrode of the ferroelectric capacitor 101. Further, the other electrode of the ferroelectric capacitor 101 is connected to the plate line 105. Here, each word line 104 and each plate line 105 are shared by a plurality of MOS transistors 102 being aligned in the same direction as the extending direction thereof. Similarly, each bit line 103 is shared by the plurality of MOS transistors 102 being aligned in the same direction as the extending direction thereof. The extending direction of the word line 104 and the plate line 105 and the extending direction of the bit line 103 may be referred to as a row direction and a column direction, respectively, in some cases. However, the arrangement of the bit line 103, the word line 104 and the plate line 105 is not limited to the aforementioned one.

In the memory cell array of the ferroelectric memory thus constituted, data is stored according to the polarization state of the ferroelectric film provided in the ferroelectric capacitor 101.

Figure 2A:
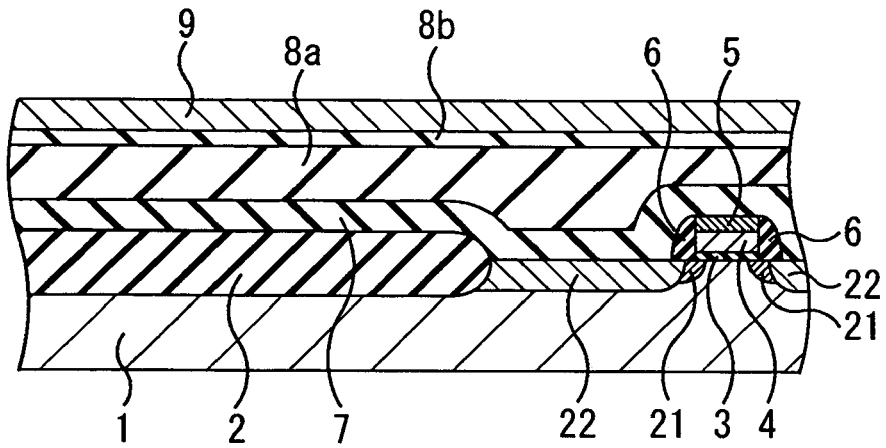
FIG. 2A shows a cross sectional view illustrating the manufacturing method of a ferroelectric memory in process order, according to the embodiment of the present invention.

Next, an embodiment of the present invention will be described. Here, for the sake of convenience, the cross sectional structure of each memory cell in the ferroelectric memory will be described together with a manufacturing method therefor. FIGS. 2A through 2N show cross sections illustrating a manufacturing method of the ferroelectric memory (semiconductor device) according to the embodiment of the present invention, shown in the process order.

In the present embodiment, first, as shown in FIG. 2A, an element isolation insulating film 2 partitioning an element activating region is formed on the surface of a semiconductor substrate 1, such as a Si substrate, by a LOCOS (local oxidation of Silicon) method, for example. Next, in the element activating region partitioned by the element isolation insulating film 2, there is formed a transistor (MOSFET) having a gate insulating film 3, a gate electrode 4, a silicide layer 5, a side wall 6 and source/drain diffusion layers constituted of a low-density diffusion layer 21 and a high-density diffusion layer 22. As the gate insulating film 3, for example, an $SiO_2$ film having a thickness of the order of 100 nm is formed by thermal oxidation, for example. Then, a silicon oxynitride film 7 is formed over the entire surface to cover the MOSFET, and further, a silicon oxide film 8a is formed over the entire surface. The silicon oxynitride film 7 is formed for the purpose of preventing hydrogen degradation of the gate insulating film 3 and the like, when the silicon oxide film 8a is formed. As the silicon oxide film 8a, a TEOS (tetraethylorthosilicate) film having a thickness of about 700 nm is formed by a CVD method, for example.

Thereafter, by performing an annealing process at 650° C. for 30 minutes in an $N_2$ atmosphere, degasification of the silicon oxide film 8a is performed. Next, as a bottom electrode adhesion layer, an $Al_2O_3$ film 8b having a thickness of about 20 nm is formed on the silicon oxide film 8a by a sputtering method, for example. Here, as the bottom electrode adhesion layer, it may also be possible to form a Ti film, a $TiO_x$ film or the like having a thickness of about 20 nm. Subsequently, a bottom electrode film 9 is formed on the $Al_2O_3$ film 8b. As the bottom electrode film 9, a Pt film having a thickness of about 150 nm is formed by a sputtering method, for example.

Figure 2B:
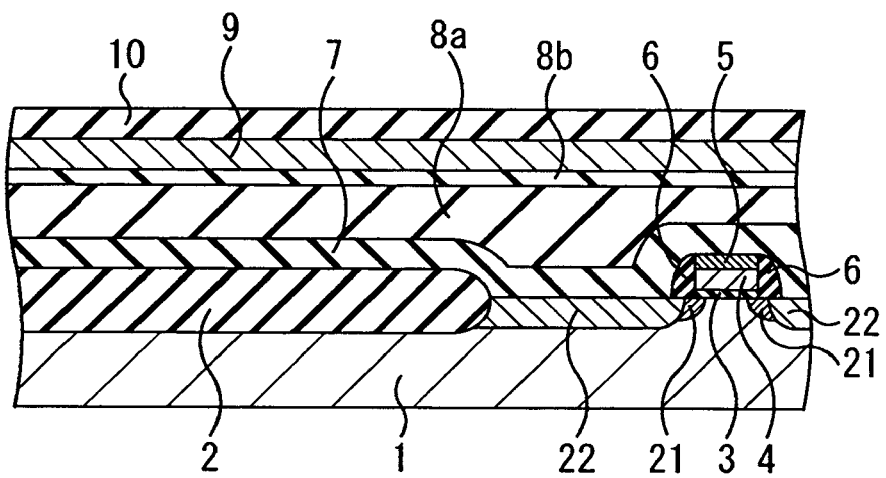
FIG. 2B shows a cross sectional view illustrating the manufacturing method of a ferroelectric memory in process order subsequently to FIG. 2A, according to the embodiment of the present invention.

Next, as shown in FIG. 2B, a ferroelectric film 10 constituted of a substance of which chemical formula is expressed as $ABO_3$ is formed on the bottom electrode film 9 in an amorphous state. As the ferroelectric film 10, a $(Pb,Ca,Sr,La)(Zr,Ti)O_3$ film having a thickness of about 100-200 nm is formed, for example, using a $(Pb,Ca,Sr,La)(Zr,Ti)O_3$ target which includes 0.1-5 mol % of Nb and 0.1-5 mol % of La by an RF sputtering method. The above ferroelectric film 10 includes 0.1-5 mol % of Nb and 0.1-5 mol % of La. Nb is disposed on the B-site of the substance expressed by $ABO_3$ as a donor element, while La is disposed on the A-site as a donor element. Next, in the atmosphere including Ar and $O_2$, thermal treatment (RTA: rapid thermal annealing) of not higher than 600° C. is performed. As a result, the ferroelectric film 10 becomes crystallized, and also the Pt film constituting the bottom electrode film 9 is densified, and thereby mutual diffusion between Pt and O in the vicinity of the boundary surface between the bottom electrode film 9 and the ferroelectric film 10 is suppressed.

Figure 2C:
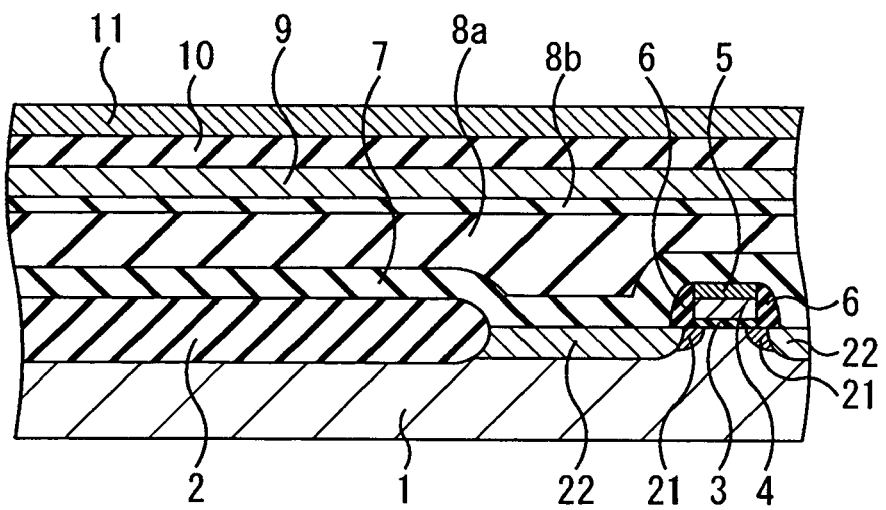
FIG. 2C shows a cross sectional view illustrating the manufacturing method of a ferroelectric memory in process order subsequently to FIG. 2B, according to the embodiment of the present invention.

Thereafter, as shown in FIG. 2C, a top electrode film 11 is formed on the ferroelectric film 10. When the top electrode film 11 is formed, for example, after an $IrO_x$ (1<x<2, for example, x=1.4) film (not shown) is formed having a thickness of about 50 nm by a sputtering method, for example, thermal treatment (RTA) is performed, and further, an $IrO_2$ film (not shown) is formed. As a result of the thermal treatment after forming the $IrO_x$ (1<x<2, for example, x=1.4) film, the ferroelectric film 10 is completely crystallized.

Figure 2D:
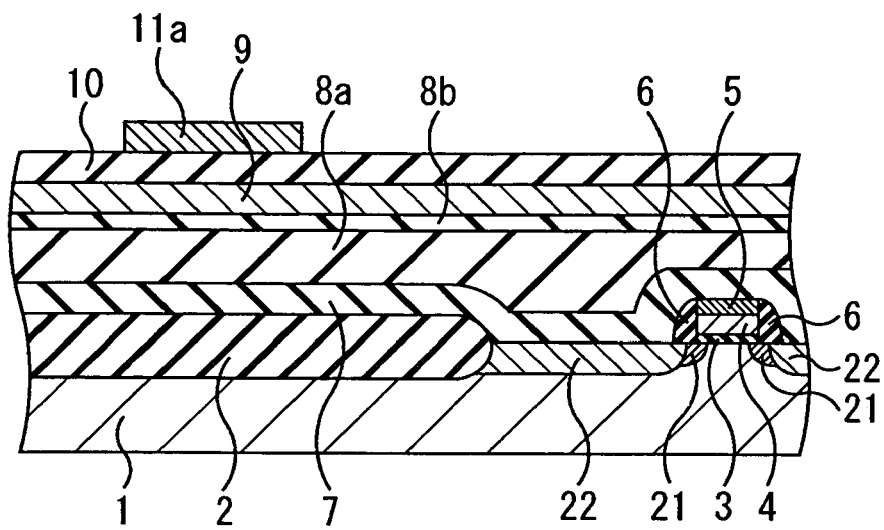
FIG. 2D shows a cross sectional view illustrating the manufacturing method of a ferroelectric memory in process order subsequently to FIG. 2C, according to the embodiment of the present invention.

Subsequently, after back surface cleaning is completed, the top electrode 11a is formed by patterning the top electrode film 11, as shown in FIG. 2D. Next, in an $O_2$ atmosphere, a recovery annealing process is performed at 650° C. for 60 minutes. The purpose of the thermal treatment is to recover physical damage and the like in the ferroelectric film 10 when the top electrode 11a is formed.

Figure 2E:
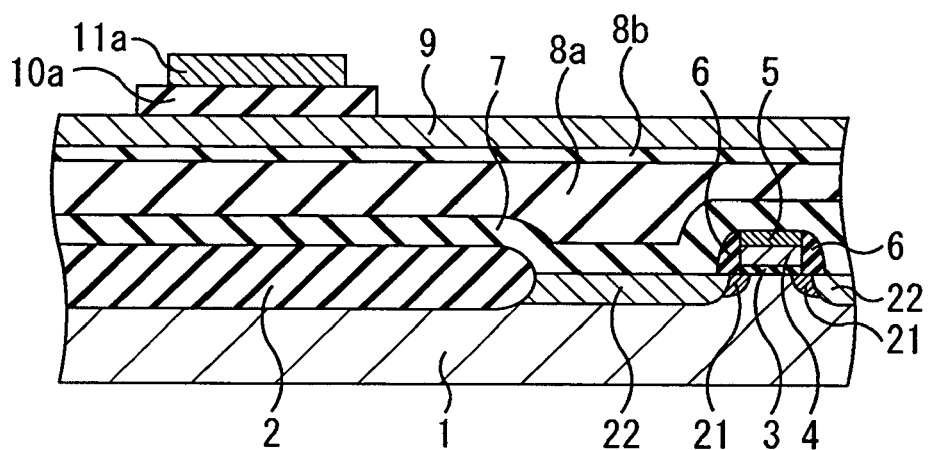
FIG. 2E shows a cross sectional view illustrating the manufacturing method of a ferroelectric memory in process order subsequently to FIG. 2D, according to the embodiment of the present invention.

Thereafter, as shown in FIG. 2E, a capacitor insulating film 10a is formed by patterning the ferroelectric film 10. Subsequently, oxygen annealing is performed to prevent an $Al_2O_3$ film to be formed later from being peeled off.

Figure 2F:
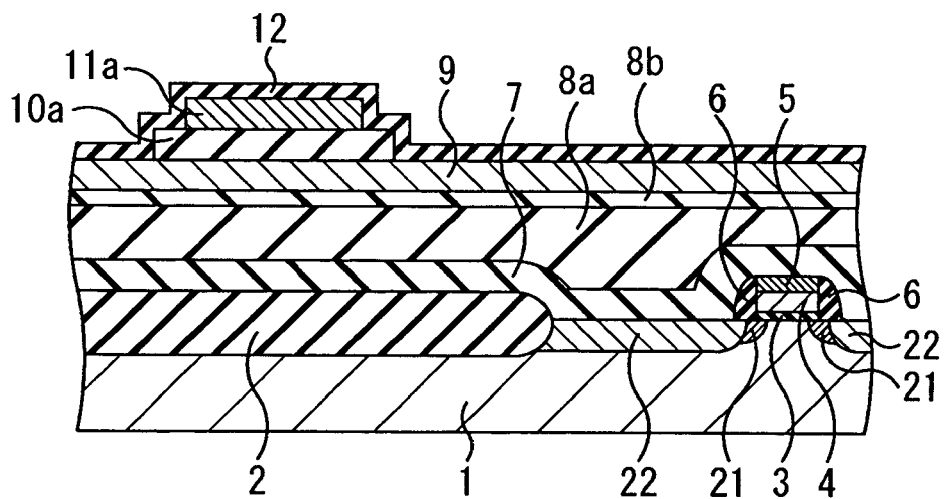
FIG. 2F shows a cross sectional view illustrating the manufacturing method of a ferroelectric memory in process order subsequently to FIG. 2E, according to the embodiment of the present invention.

Next, as shown in FIG. 2F, an $Al_2O_3$ film 12 is formed over the entire surface as a protective film by a sputtering method. Then, oxygen annealing is performed to alleviate the damage produced during the sputtering. The protective film ($Al_2O_3$ film 12) enables prevention of hydrogen from penetrating into the ferroelectric capacitor from the outside.

Figure 2G:
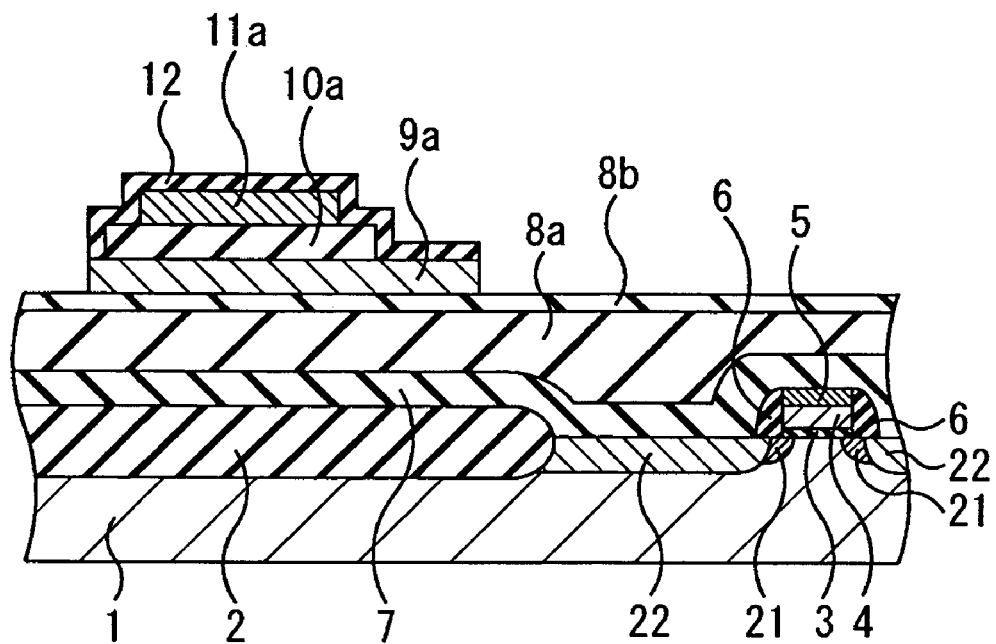
FIG. 2G shows a cross sectional view illustrating the manufacturing method of a ferroelectric memory in process order subsequently to FIG. 2F, according to the embodiment of the present invention.

Thereafter, as shown in FIG. 2G, a bottom electrode 9a is formed by patterning of the $Al_2O_3$ film 12 and the bottom electrode film 9. Subsequently, oxygen annealing is performed to prevent another $Al_2O_3$ film to be formed later peeling of.

Figure 2H:
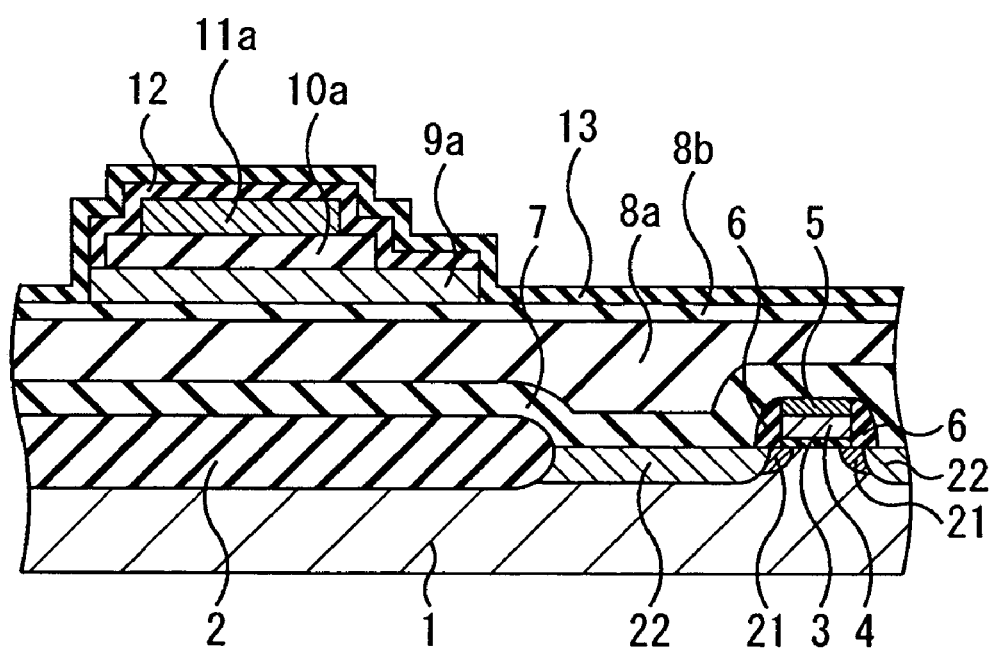
FIG. 2H shows a cross sectional view illustrating the manufacturing method of a ferroelectric memory in process order subsequently to FIG. 2G, according to the embodiment of the present invention.

Next, as shown in FIG. 2H, an $Al_2O_3$ film 13 is formed over the entire surface as a protective film by a sputtering method. Then, oxygen annealing is performed to reduce a capacitor leak.

Figure 2I:
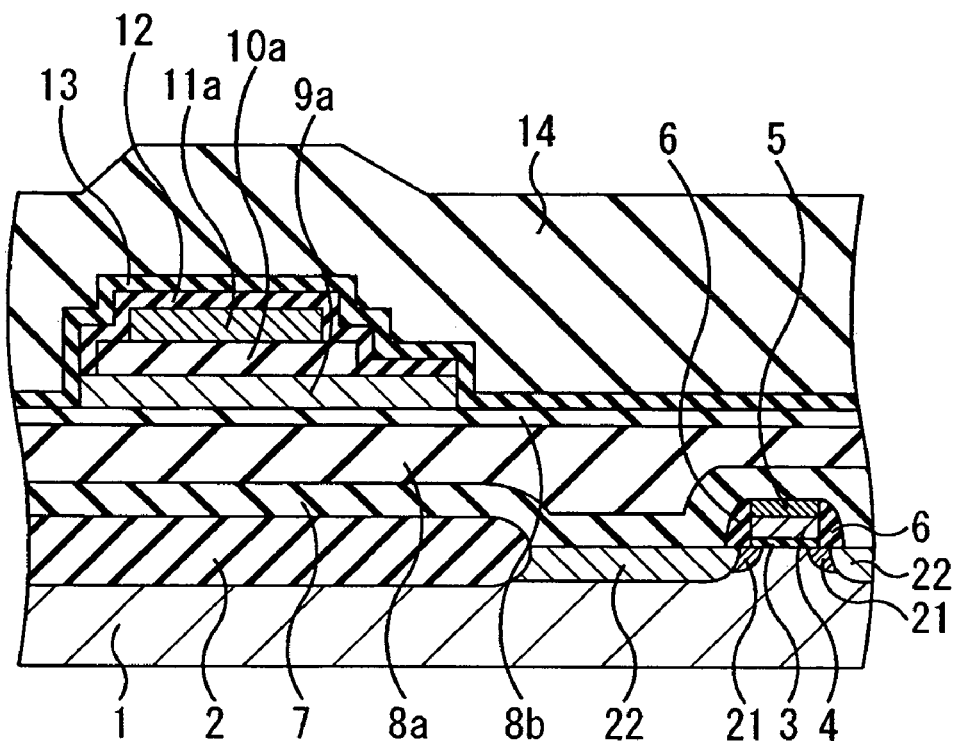
FIG. 2I shows a cross sectional view illustrating the manufacturing method of a ferroelectric memory in process order subsequently to FIG. 2H, according to the embodiment of the present invention.

Thereafter, as shown in FIG. 2I, an interlayer insulating film 14 is formed over the entire surface by a high-density plasma method. The interlayer insulating film 14 has a thickness of about 1.5 μm, for example.

Figure 2J:
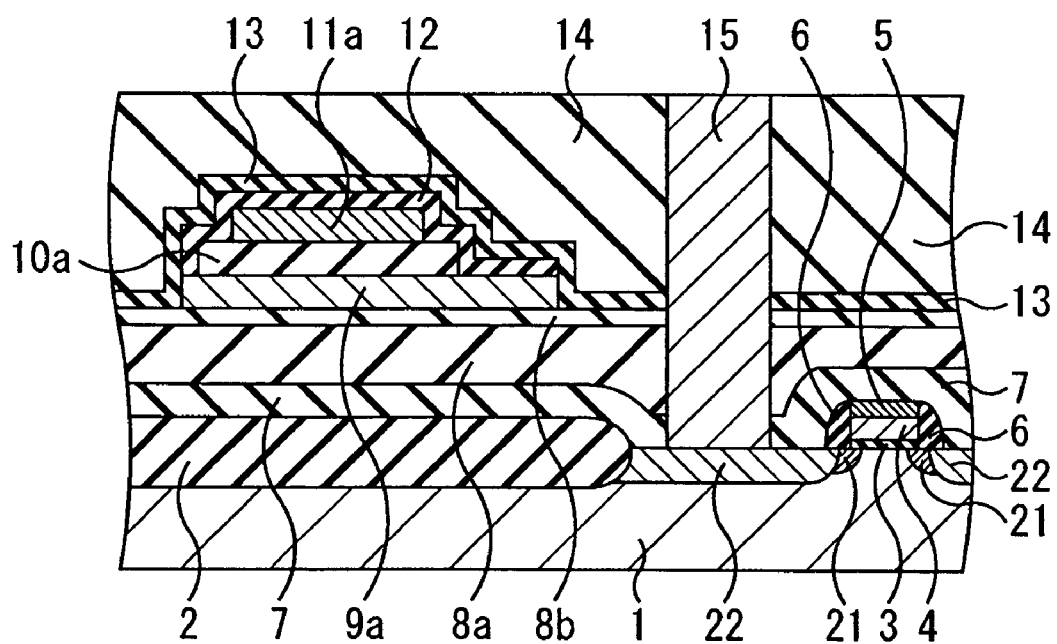
FIG. 2J shows a cross sectional view illustrating the manufacturing method of a ferroelectric memory in process order subsequently to FIG. 2I, according to the embodiment of the present invention.

Subsequently, as shown in FIG. 2J, by a CMP (chemical mechanical polishing) method, the interlayer insulating film 14 is planarized. Next, a plasma process is performed by use of a $N_2O$ gas. As a result, the surface layer portion of the interlayer insulating film 14 is nitrided to some extent, making moisture hard to penetrate inside thereof. Here, the above plasma process is effective when a gas including at least one of N or O is used. Then, a hole reaching the high-density diffusion layer 22 of the transistor is formed through the interlayer insulating film 14, the $Al_2O_3$ film 13, the $Al_2O_3$ film 8b, the silicon oxide film 8a and the silicon oxynitride film 7. Thereafter, by forming a Ti film and a TiN film consecutively inside the hole by a sputtering method, a barrier metal film (not shown) is formed. Subsequently, a W (tungsten) film is embedded into the hole by ma CVD (chemical vapor deposition) method, and the W film is planarized by a CMP method, so that a W plug 15 is formed.

Figure 2K:
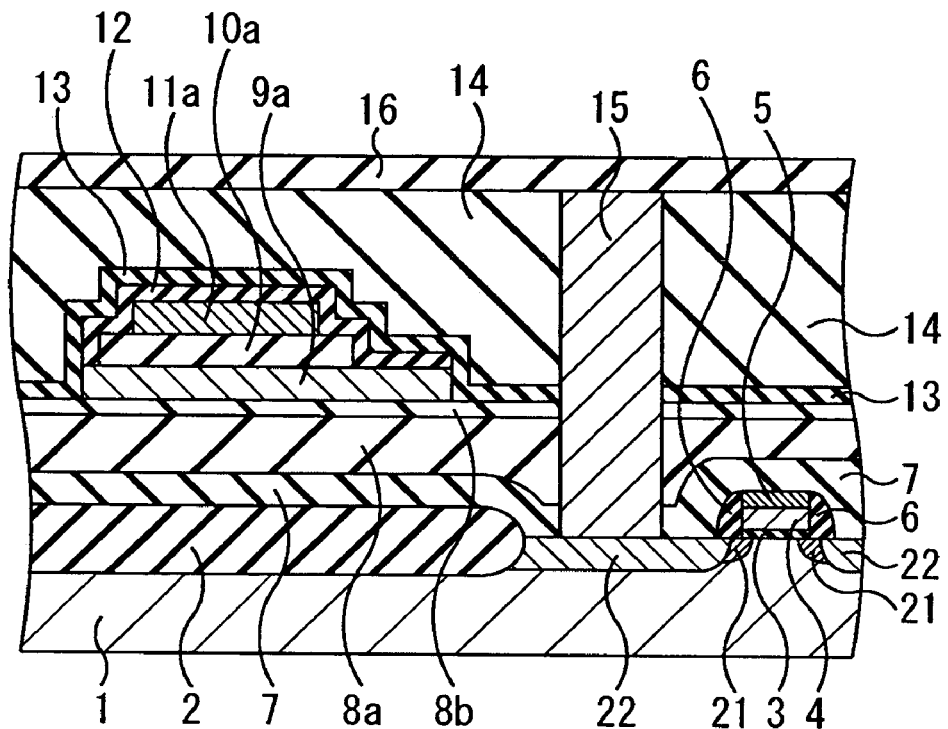
FIG. 2K shows a cross sectional view illustrating the manufacturing method of a ferroelectric memory in process order subsequently to FIG. 2J, according to the embodiment of the present invention.

Next, as shown in FIG. 2K, as an antioxidation film for the W plug 15, an SiON film 16 is formed by a plasma-enhanced CVD method, for example.

Figure 2L:
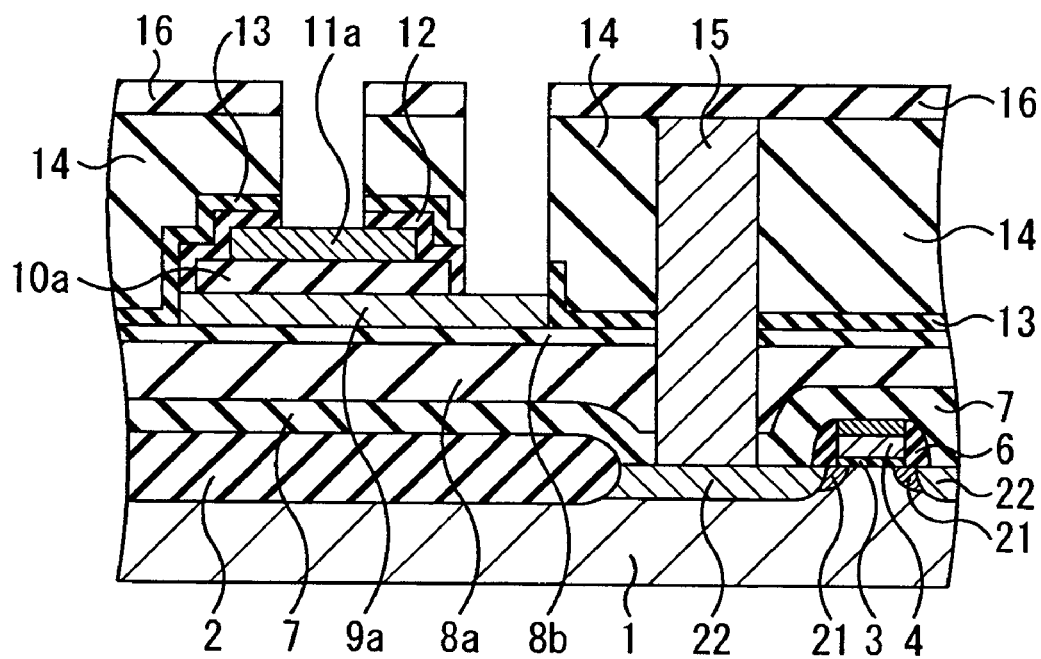
FIG. 2L shows a cross sectional view illustrating the manufacturing method of a ferroelectric memory in process order subsequently to FIG. 2K, according to the embodiment of the present invention.

Then, as shown in FIG. 2L, a hole reaching the top electrode 11a and a hole reaching the bottom electrode 9a are formed through the SiON film 16, the interlayer insulating film 14, the $Al_2O_3$ film 13 and the $Al_2O_3$ film 12. Thereafter, oxygen annealing is performed for damage recovery.

Figure 2M:
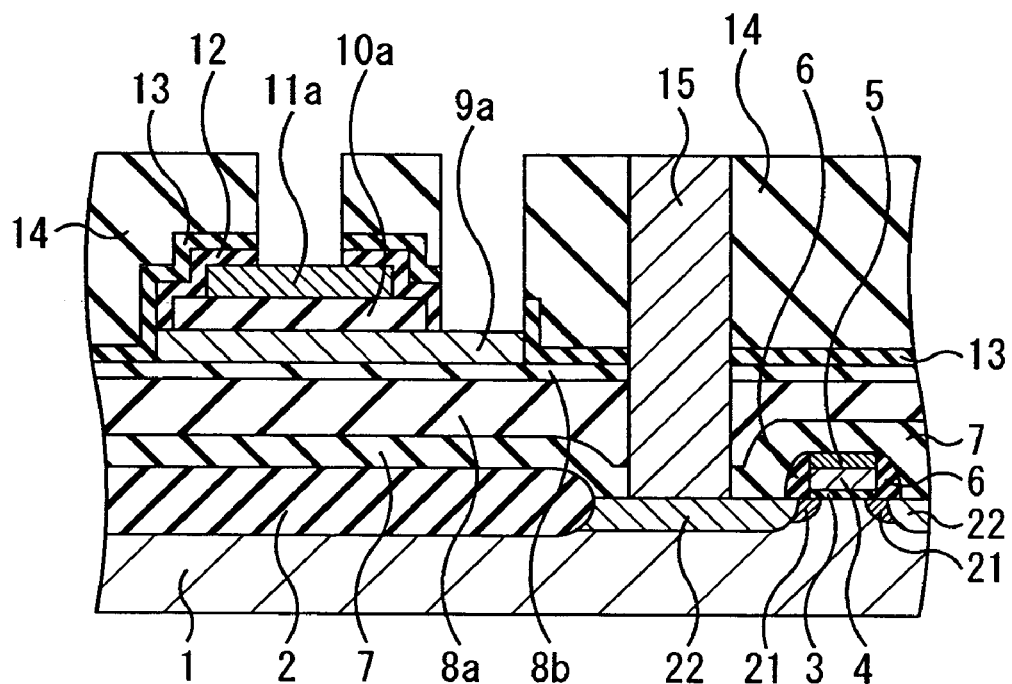
FIG. 2M shows a cross sectional view illustrating the manufacturing method of a ferroelectric memory in process order subsequently to FIG. 2L, according to the embodiment of the present invention.
Figure 2N:
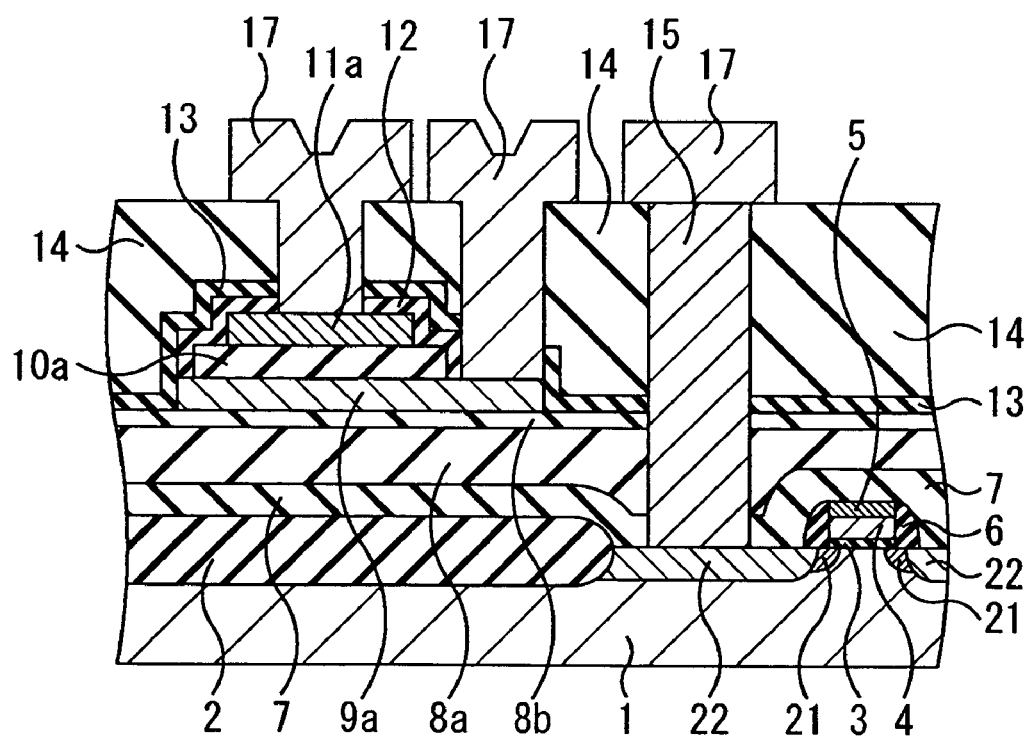
FIG. 2N shows a cross sectional view illustrating the manufacturing method of a ferroelectric memory in process order subsequently to FIG. 2M, according to the embodiment of the present invention.

Subsequently, as shown in FIG. 2M, the SiON film 16 is removed over the entire surface by etch-back, so that the surface of the W plug 15 is exposed. Next, as shown in FIG. 2N, in a state that a portion of the surface of the top electrode 11a, a portion of the surface of the bottom electrode 9a, and the surface of the W plug 15 are exposed, an Al film is formed, and by patterning the Al film, Al wirings 17 are formed. At this time, for example, the W plug 15 is connected to the top electrode 11a or the bottom electrode 9a, by use of a portion of the Al wirings 17.

Thereafter, further, the formations of the interlayer insulating film and a contact plug, as well as wirings of the second layer from the bottom and succeeding layers and the like are performed. Then, a cover film is formed constituted of, for example, a TEOS oxidized film and a SiN film, so that a ferroelectric memory having a ferroelectric capacitor is completed.

According to the present embodiment, as described above, the ferroelectric film 10 including 0.1-5 mol % of Nb and 0.1-5 mol % of La is formed. The ferroelectric film 10 having such a composition can improve the in-plane orientation distribution and the crystallinity of the ferroelectric film 11 formed thereon. Accordingly, it becomes possible to suppress a coercive voltage and a leak current to low values, while obtaining a high switching charge $Q_{SW}$.

Now, test results having actually been performed by the inventor of the present invention will be described next.

(First Test)

In a first test, there were formed ferroelectric capacitors each having a square plane shape with side lengths of 50 μm, and the in-plane orientation distribution of the ferroelectric films therein, a crystallinity, and electric characteristics (nonlinear capacity, electrostatic capacity, switching charge $Q_{SW}$, coercive voltage $V_C$, leak current and the like) were examined. As the ferroelectric films, $(Pb,Ca,Sr)(Zr,Ti)O_3$ films added with La and Nb were formed. The contents (mol %) of La and Nb in the ferroelectric film of each specimen and each ferroelectric film thickness (nm) are shown in Table 1.

TABLE 1

|  | Specimens | | | | | | | |
| --- | --- | --- | --- | --- | --- | --- | --- | --- |
|  | No. 1 | No. 2 | No. 3 | No. 4 | No. 5 | No. 6 | No. 7 | No. 8 |
| La | 3 | 3 | 1.5 | 1.5 | 1.5 | 1.5 | 1.5 | 1.5 |
| Nb | 0 | 0 | 0 | 0 | 1 | 1 | 4 | 4 |
| Thickness | 150 | 120 | 150 | 120 | 150 | 120 | 150 | 120 |

Figure 3:
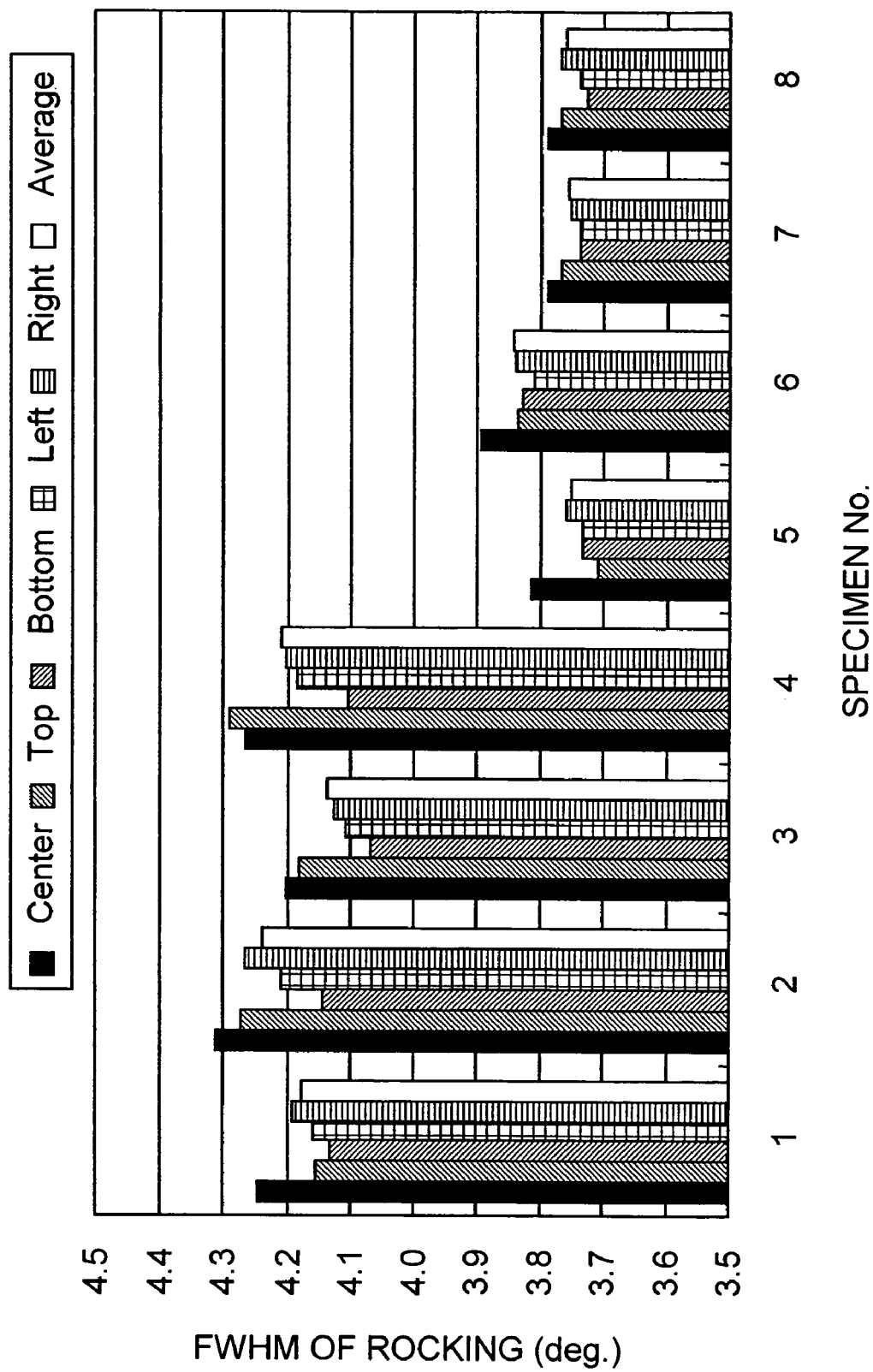
FIG. 3 shows a graph illustrating examination results of an in-plane orientation distribution and crystallinity.

In FIG. 3, the examination results of the in-plane orientation distribution and the crystallinity are shown. In the examination, by forming the ferroelectric film and forming an $IrO_x$ film having a thickness of 50 nm by a sputtering method thereon, and after performing RTA (thermal treatment) for 90 seconds, the crystallinity of each specimen was measured by a four-axis X-ray diffraction method. The FWHM (Full Width Half Maximum) of rocking shown in FIG. 3 represents a FWHM (Full Width Half Maximum) of rocking of the (111) plane, which indicates better crystallinity, as the value thereof is smaller.

As shown in FIG. 3, when comparing between the specimens No. 1 to No. 4 not added with Nb and the specimens No. 5 to No. 8 added with Nb, a better crystallinity and a more uniform in-plane distribution are obtained in the specimens No. 5 to No. 8. The fact that the FWHM (Full Width Half Maximum) of rocking becomes smaller by 0.4 degree indicates that the crystallinity has been improved remarkably.

Figure 4A:
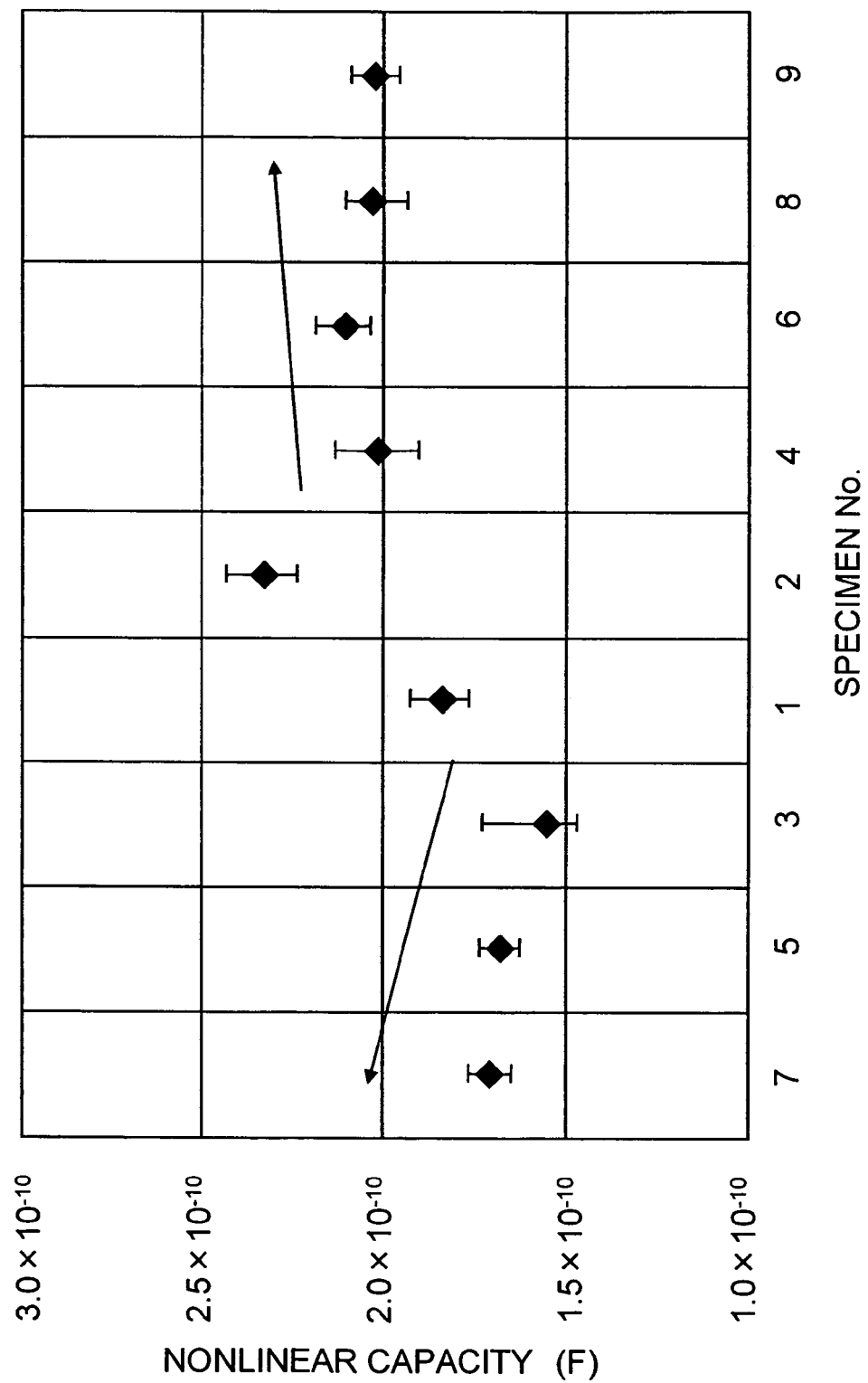
FIG. 4A shows a graph illustrating an examination result of a nonlinear capacity.
Figure 4B:
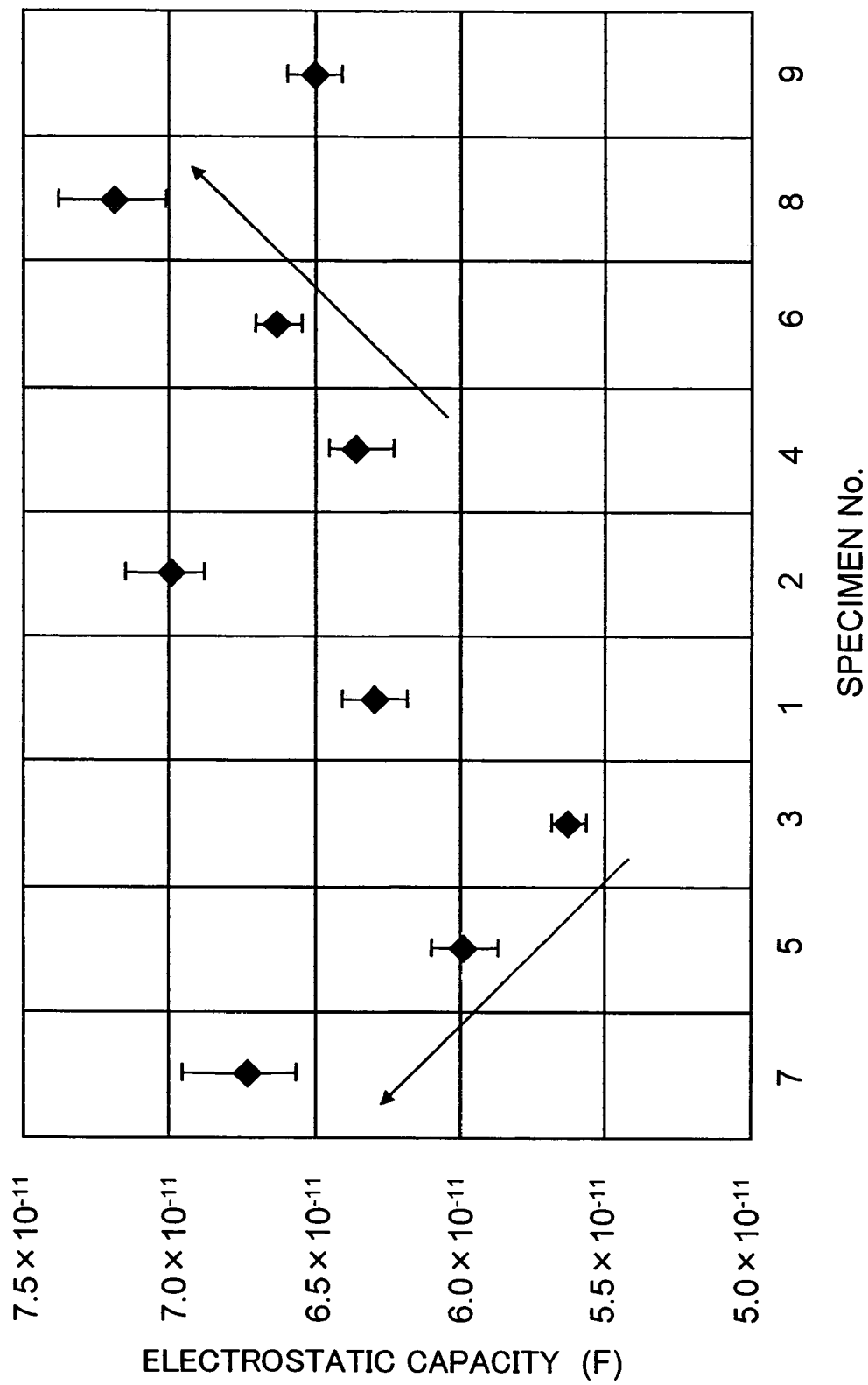
FIG. 4B shows a graph illustrating an examination result of an electrostatic capacity.

In FIGS. 4A and 4B, the examination results of the nonlinear capacity and the electrostatic capacity are shown, respectively. In the examination, after performing the above-mentioned examinations on the crystallinity and the like, patterning of the top electrode film, the ferroelectric film and the bottom electrode film was performed, and capacity measurement of each specimen was carried out at 40 points in plane. In the measurement of the nonlinear capacity, the measuring voltage was set at 0 V ±10 mV, while in the measurement of the electrostatic capacity, the measuring voltage was set at 3 V ±10 mV. In FIGS. 4A and 4B, the maximum values and the minimum values are shown together with the mean values (points shown by the lozenges). The specimen No. 9 shown in FIGS. 4A and 4B is a specimen in which a heat treatment time of 30 seconds on RTA was applied to the specimen No. 6.

As shown in FIGS. 4A and 4B, when comparing the specimens No. 1 and No. 2 having the La content of 3.0 mol % with the specimens No. 3 and No. 4 having 1.5 mol %, higher nonlinear capacity and higher electrostatic capacity were obtained in the specimens No. 1 and No. 2. Also, when taking notice of the Nb content, higher nonlinear capacity and higher electrostatic capacity were obtained in the specimens having larger Nb contents. Further, when taking notice of a ferroelectric film thickness, higher nonlinear capacity and higher electrostatic capacity were obtained in the specimens No. 2, No. 4, No. 6, No. 8 and No. 9, each having a thickness of 120 nm, than in the specimens No. 1, No. 3, No. 5 and No. 7, each having a thickness of 150 nm.

Figure 5B:
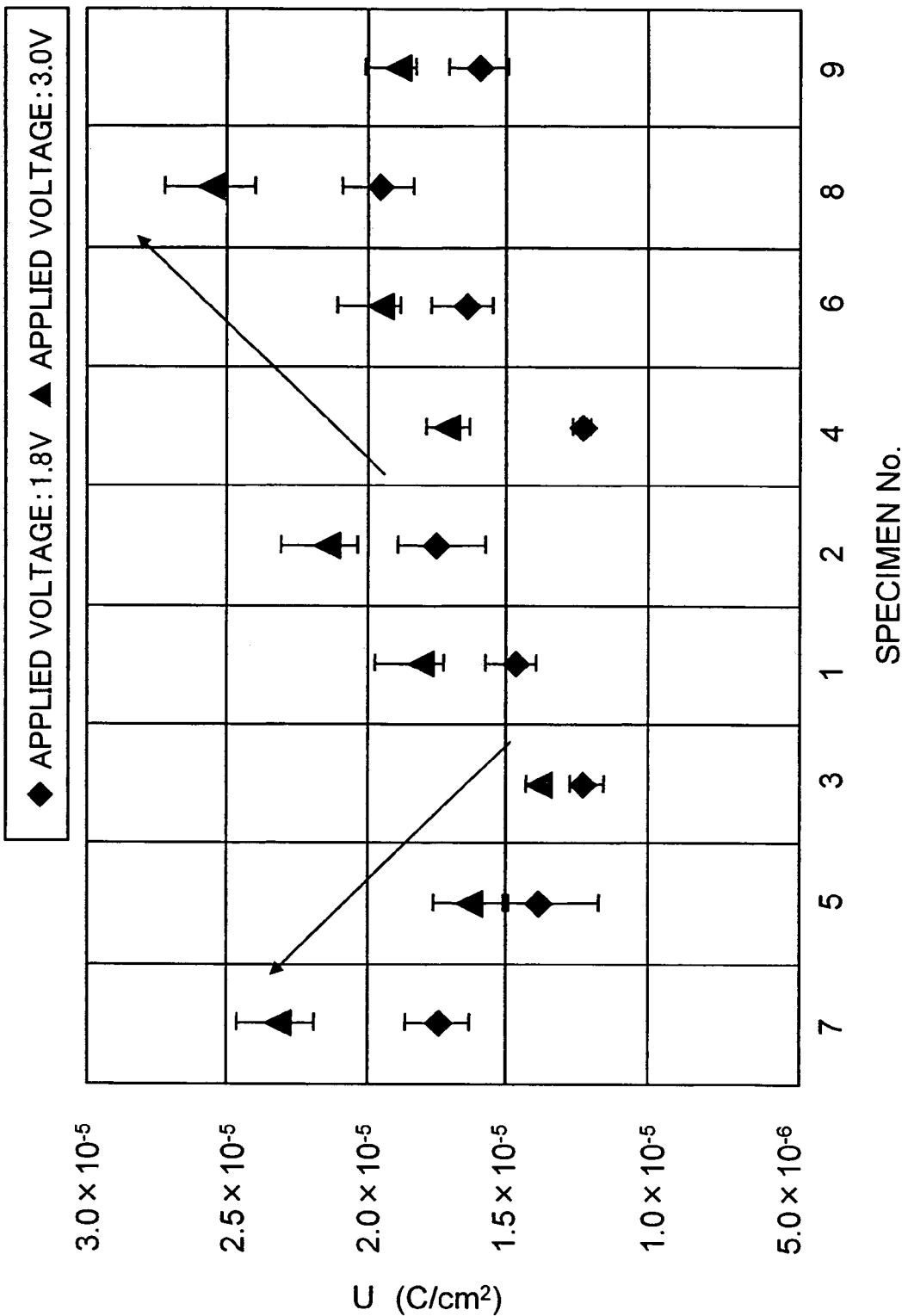
FIG. 5B shows a graph illustrating an examination result of a value U.
Figure 6:
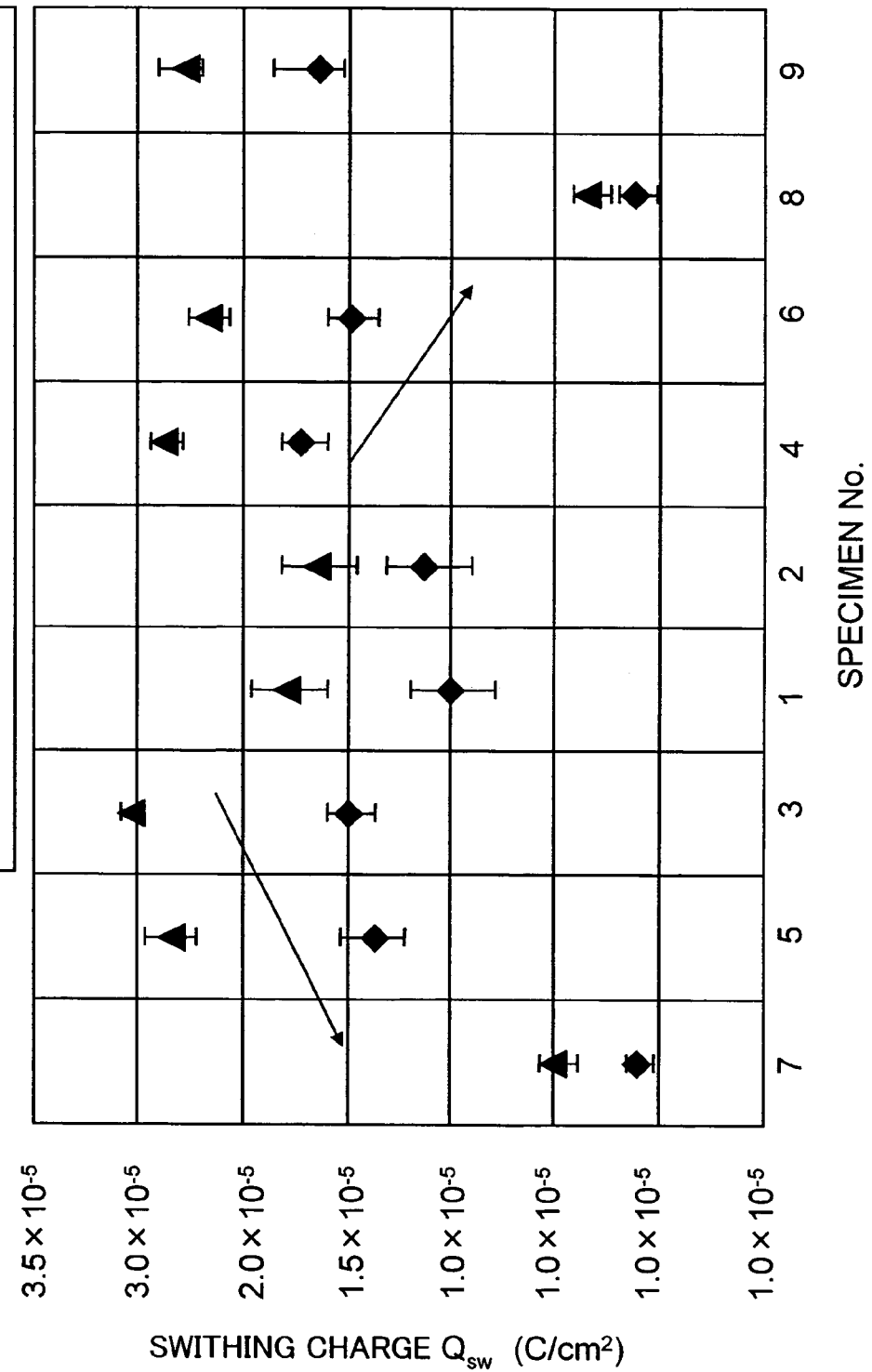
FIG. 6 shows a graph illustrating an examination result of a switching charge $Q_{SW}$.
Figure 15:
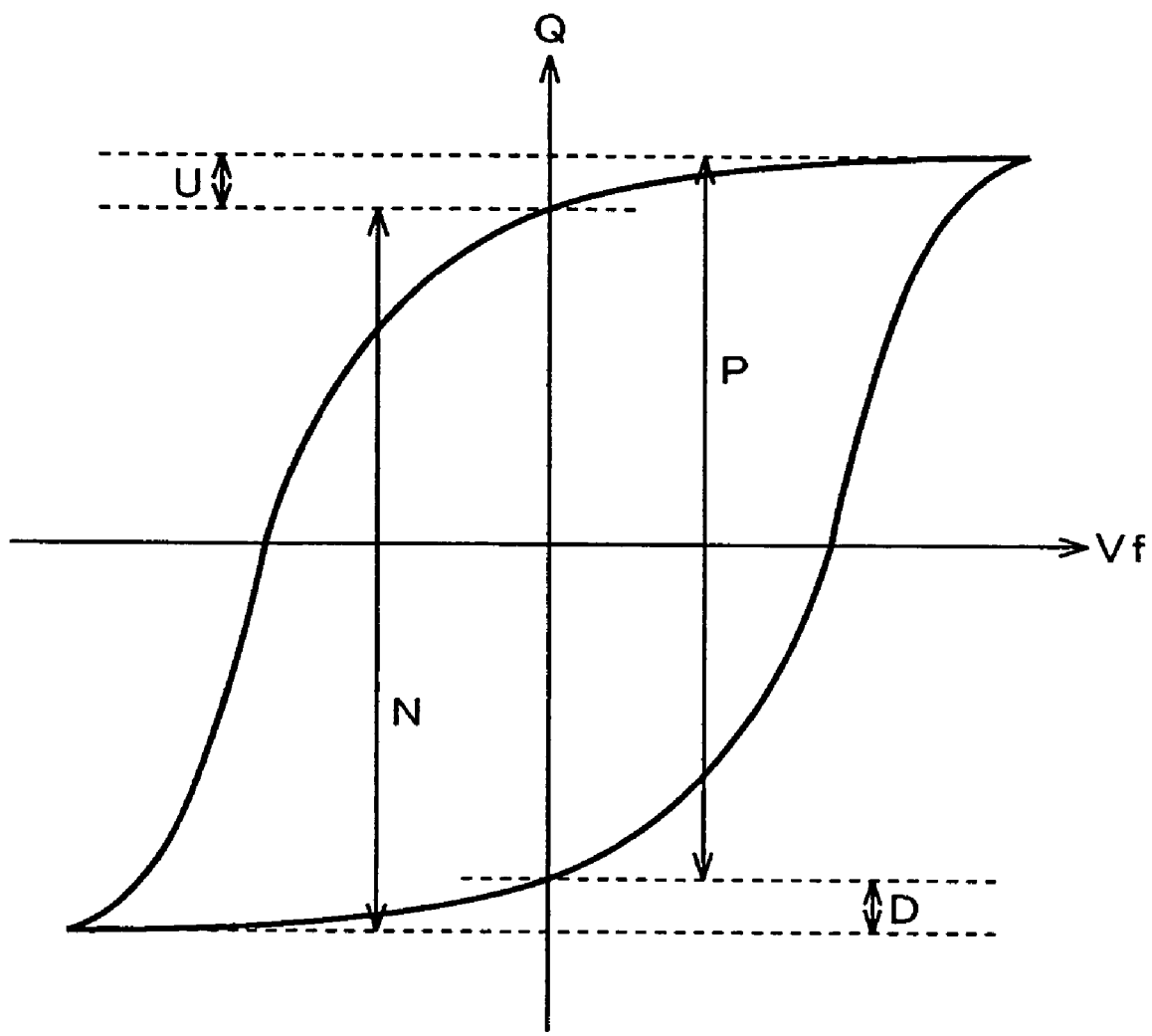
FIG. 15 shows a graph illustrating a relationship between an applied voltage and a polarization.

Also, for each specimen, a hysteresis loop as shown in FIG. 15, which indicates the relationship between an applied voltage and a polarization, was obtained, and a variety of values were obtained from the hysteresis loop. The results thereof are shown in FIGS. 5A, 5B and 6. Here, the switching charge $Q_{SW}$ is a value found from Formula 1 shown below, using values P, U, N and D obtained from the hysteresis loop.

$$Q_{SW} = \frac{(P-U)+(N-D)}{2} \quad \text{Formula 1}$$

When comparing the specimens No. 1 and No. 2 with the specimens No. 3 and No. 4, as the La content was smaller, the value P became larger (FIG. 5A) and the value U became smaller (FIG. 5B). Also, when taking notice of the Nb content, the specimen having a larger Nb content had a smaller value P (FIG. 5A) and had a larger value U (FIG. 5B). Here, when comparing the specimens No. 3 and No. 4 having the Nb content of 0 mol % with the specimens No. 5 and No. 6 having 1 mol %, the difference between the values P and U was relatively small. Meanwhile, when comparing the specimens No. 5 and No. 6 having the Nb content of 1 mol % with the specimens No. 7 and No. 8 having 4 mol %, the difference between the values P and U was relatively large. Further, when taking notice of the ferroelectric film thickness, higher values P and U were obtained in the specimens No. 2, No. 4, No. 6, No. 8 and No. 9 each having a thin thickness.

Also, as shown in FIG. 6, when comparing the specimens No. 1 and No. 2 with the specimens No. 3 and No. 4, in the specimens having smaller La contents, each switching charge $Q_{SW}$ became higher. Also, when taking notice of the Nb content, the specimen having a larger Nb content had a smaller switching charge $Q_{SW}$. Here, when comparing the specimens No. 3 and No. 4 having the Nb content of 0 mol % with the specimens No. 5 and No. 6 having 1 mol %, the variation of a saturated switching charge (applied voltage: 3 V) was small, whereas the variation of the switching charge when the applied voltage was set at 1.8 V was large. Also, when comparing the specimens No. 5 and No. 6 having the Nb content of 1 mol % with the specimens No. 7 and No. 8 having 4 mol %, there were a large saturated switching charge and a large variation of the switching charge when the applied voltage was set at 1.8 V. Further, when taking notice of the ferroelectric film thickness, in the specimens No. 2, No. 4, No. 6, No. 8 and No. 9 having thin thickness, there was a large switching charge when the applied voltage was set at 1.8 V, whereas the saturated switching charge was small.

Figure 7:
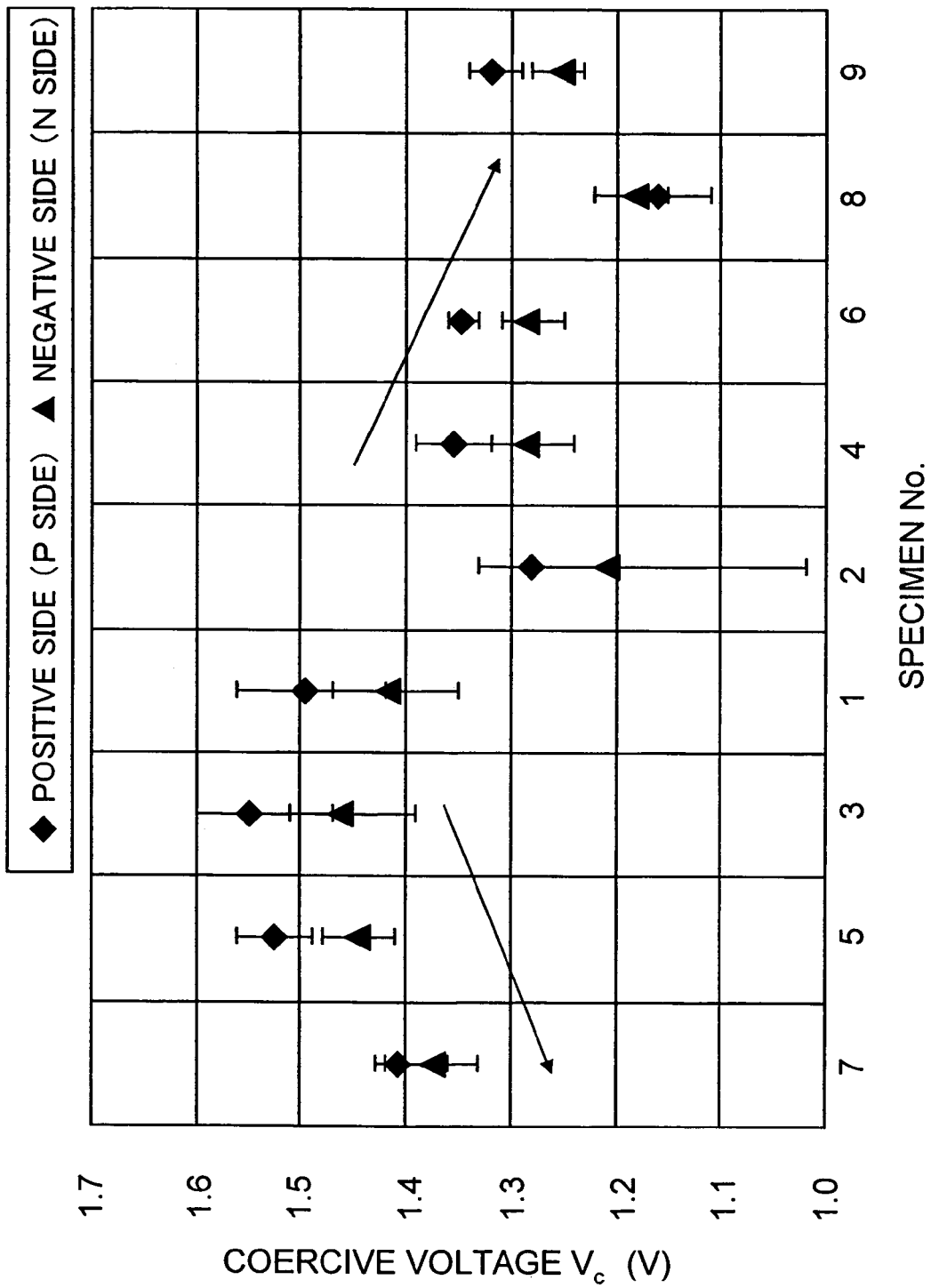
FIG. 7 shows a graph illustrating an examination result of a coercive voltage $V_C$.

Also, on the occasion of the examination of the coercive voltage $V_C$, after obtaining the relationship between the applied voltage and the value P, an applied voltage having the largest ratio of the variation of the value P to the variation of the applied voltage was determined as the coercive voltage $V_C$. The result thereof is shown in FIG. 7. It should be noted that the smaller the coercive voltage $V_C$ is, the faster the polarity reversal speed becomes.

As shown in FIG. 7, when comparing the specimens No. 1 and No. 2 with the specimens No. 3 and No. 4, the smaller La content the specimen had, the smaller the coercive voltage $V_C$ became. Also, when taking notice of the Nb content, the smaller Nb content the specimen had, the smaller the coercive voltage $V_C$ became. Further, when taking notice of the ferroelectric film thickness, in the specimens No. 2, No. 4, No. 6, No. 8 and No. 9 having the thinner thickness, the coercive voltage $V_C$ became the smaller.

Figure 8:
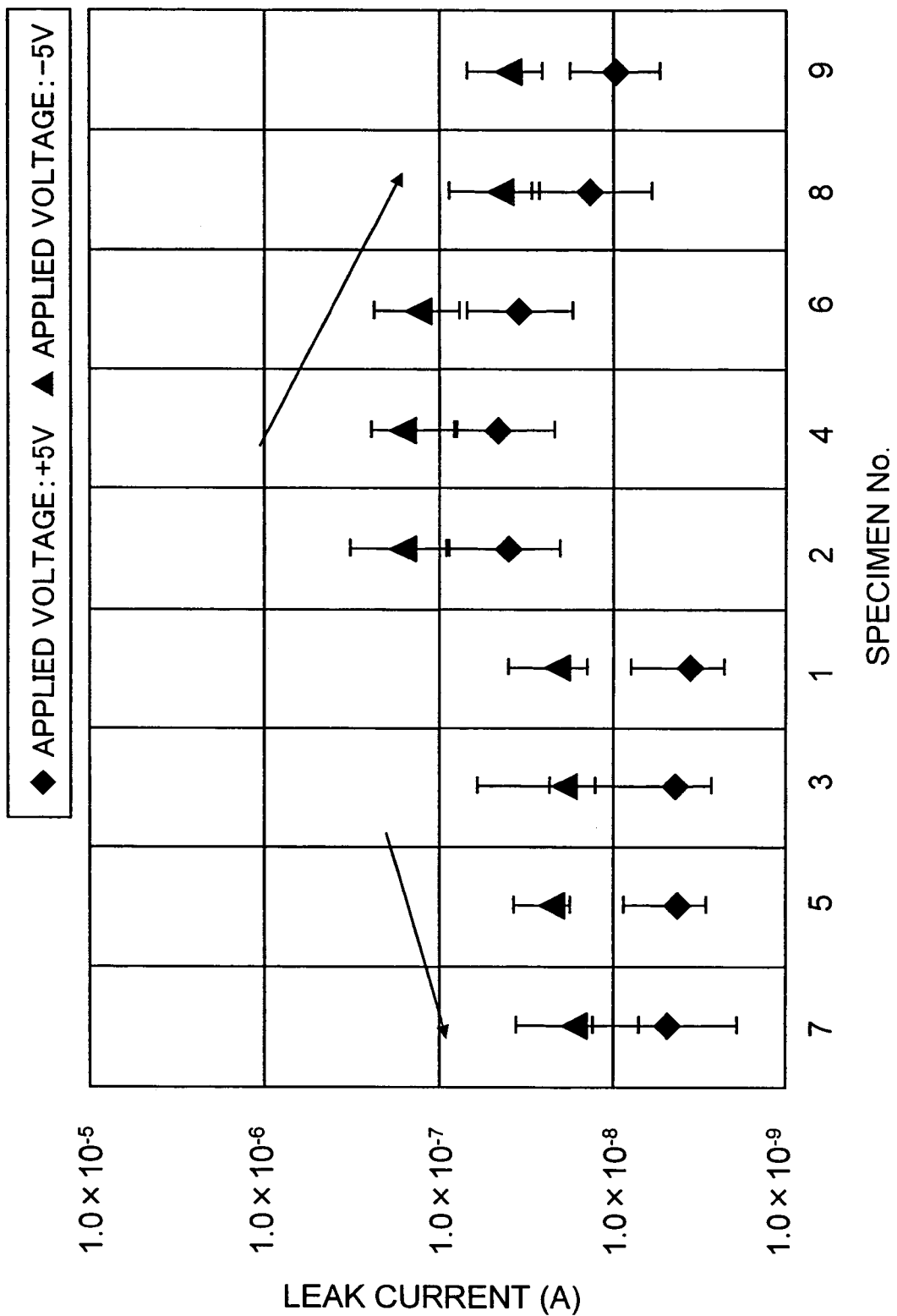
FIG. 8 shows a graph illustrating an examination result of a leak current.

Also, as shown in FIG. 8, when comparing the specimens No. 1 and No. 2 with the specimens No. 3 and No. 4, the less La content the specimen had, the larger the leak current became to a certain amount. Taking notice of the Nb content, the more Nb content the specimen had, the smaller the leak current became. Further, taking notice of the ferroelectric film thickness, in the specimens No. 2, No. 4, No. 6, No. 8 and No. 9 having the thinner thickness, the leak current became the larger. Here, the applied voltage of "+5 V" indicates that the voltage "+5 V" was applied to the bottom electrode with a criterion of the top electrode potential, while the applied voltage of "−5 V" indicates that the voltage "−5 V" was applied to the bottom electrode with a criterion of the top electrode potential.

As such, for example, when comparing the specimens No. 3 and No. 4 including no Nb with the specimens No. 5 and No. 6 including Nb, better crystallinity and more uniform orientation were obtained in the specimens No. 5 and No. 6, and also, the switching charge $Q_{SW}$ became larger, and both the coercive voltage $V_C$ and the leak current became smaller. It should be noted that, although the coercive voltage $V_C$ and the leak current can be reduced by adding La and Nb, the more the addition amount becomes, the smaller the switching charge becomes. Therefore, preferably, the addition of La and Nb is no greater than 5 mol %, respectively, and more preferably, no greater than 4 mol %. Also, in the first test, there has been formed the ferroelectric film further including Sr and Ca as the donor elements in the A-site. Instead of including the above Sr and Ca, the similar result may be obtained if Nb is included as the donor element in the B-site.

(Second Test)

In a second test, ferroelectric capacitors (discrete) each having a square plane shape with side lengths of 50 μm were formed, and the electric characteristics thereof were examined. Also, a memory cell array having 1428 ferroelectric capacitors in number, each having a rectangular plane shape with long-side lengths of 1.80 μm and short-side lengths of 1.15 μm was formed, and the electric characteristics thereof were examined. The examinations were performed after wirings were formed. As ferroelectric films, (Pb,Ca,Sr)(Zr,Ti)O$_3$ films to which La and Nb were added, were formed. The contents (mol %) of La and Nb in the ferroelectric film of each specimen and the thickness (nm) of the ferroelectric film are shown in Table 2.

TABLE 2

| | Specimens | |
|---|---|---|
| | No. 11 | No. 12 |
| La | 3 | 1.5 |
| Nb | 0 | 1 |
| Thickness | 150 | 150 |

Figure 9A:
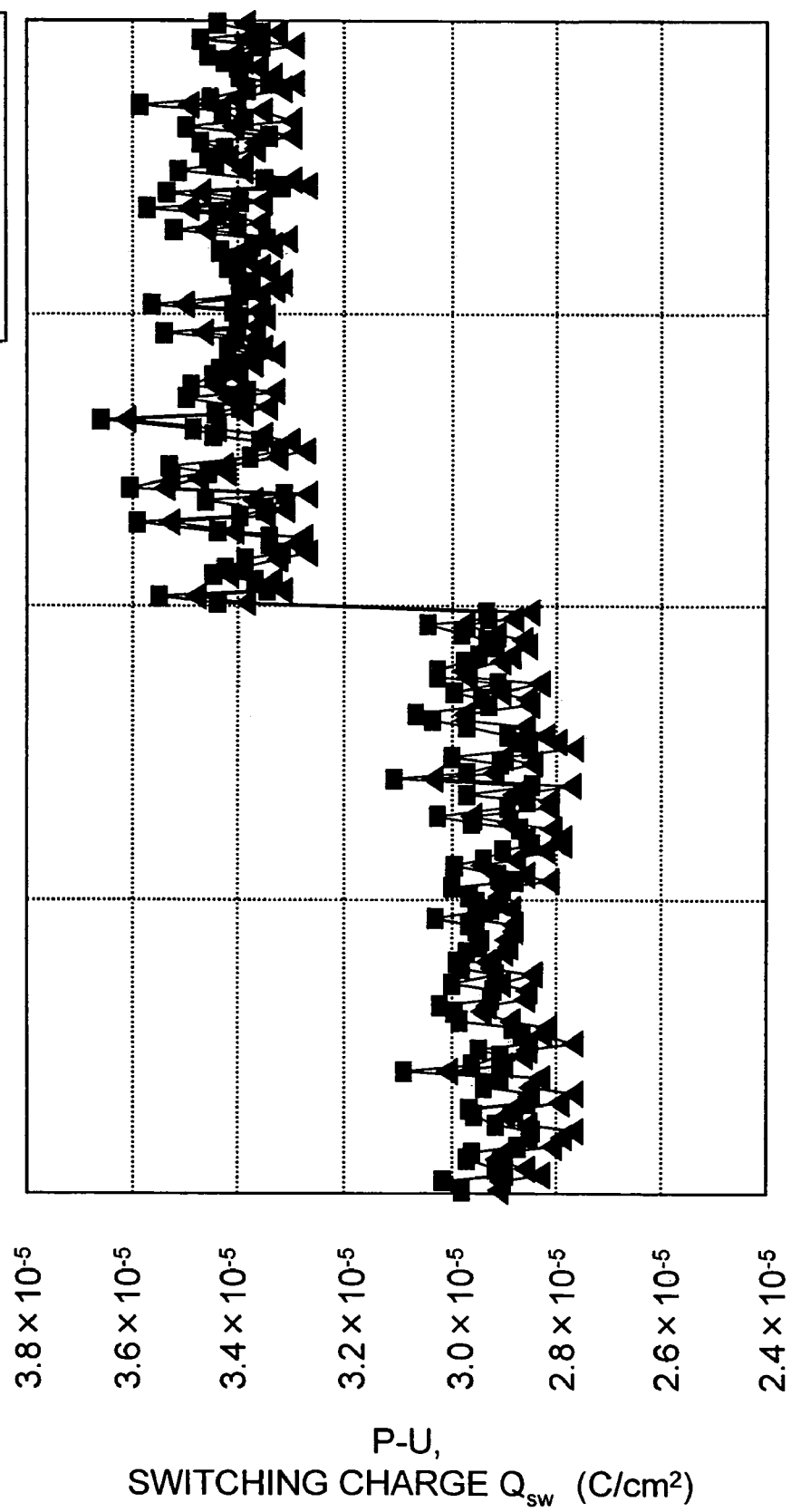
FIG. 9A shows a graph illustrating examination results of a switching charge $Q_{SW}$ and a difference (P–U) (discrete).
Figure 9B:
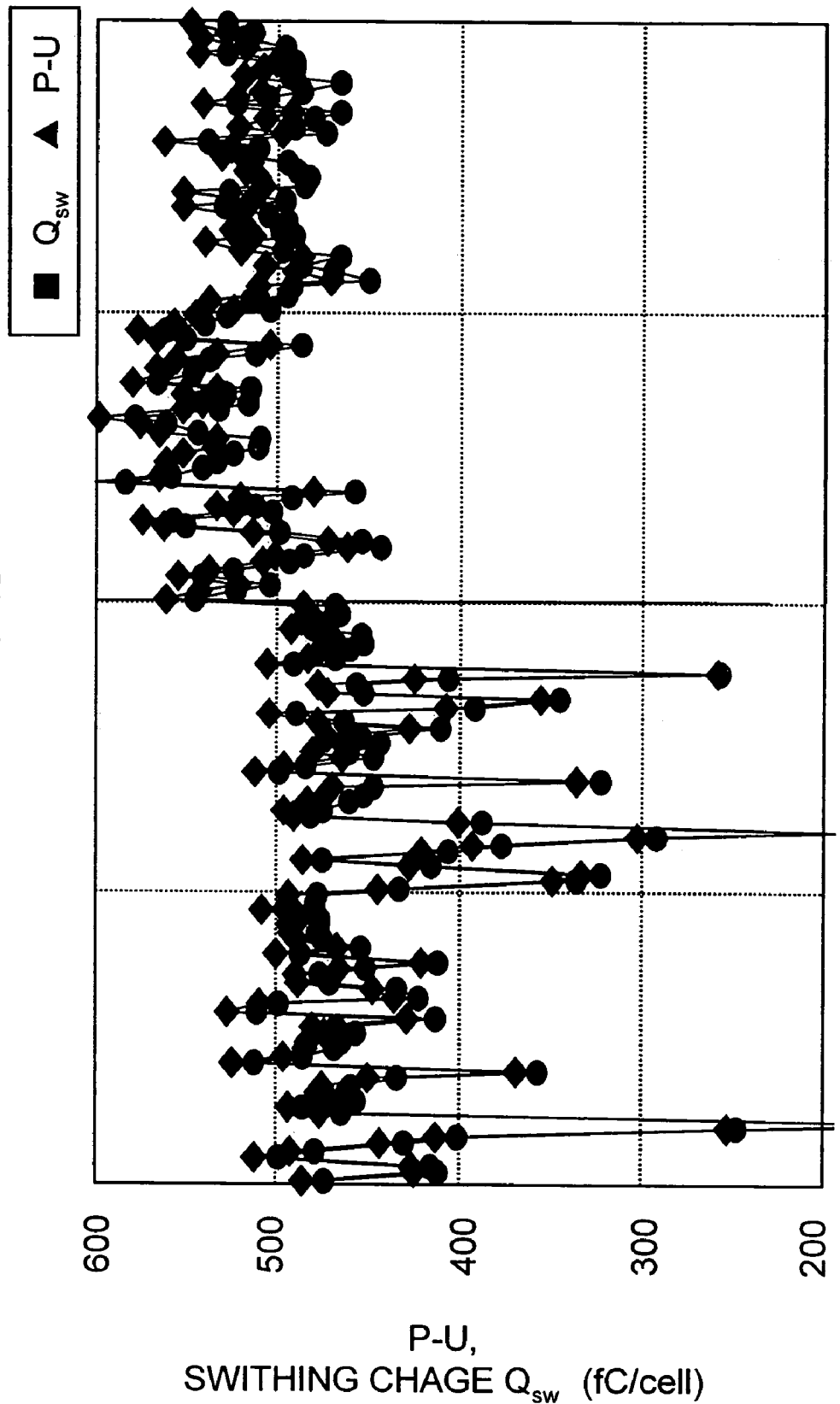
FIG. 9B shows a graph illustrating examination results of a switching charge $Q_{SW}$ and a difference (P–U) (memory cell array).

As a kind of the electric characteristics, a hysteresis loop at the time of applied voltage of 3 V was obtained, from which the switching charge $Q_{SW}$ and the differences (P−U) between the values P and U were obtained. The results thereof are shown in FIGS. 9A and 9B. In FIG. 9A, the discrete result is shown, while in FIG. 9B, the result of the memory cell array is shown.

As shown in FIGS. 9A and 9B, when compared with the specimen No. 11, the specimen No. 12 had increases of the switching charge $Q_{SW}$ of about 16% in the discrete, and of about 18% in the memory cell array. The reason is that the content La is smaller in the specimen No. 12.

Also, as a kind of the electric characteristics, leak currents were measured. The results thereof are shown in FIGS. 10A and 10B. In FIG. 10A, the discrete result is shown, while in FIG. 10B, the result of the memory cell array is shown.

As shown in FIGS. 10A and 10B, the leak currents came to the same order in between the specimen No. 11 and the specimen No. 12. This result means that, although the leak current will increase if the La content is simply lowered, the increase of the leak current was suppressed in the specimen No. 12 because of inclusion of Nb. In other words, the addition of Nb canceled the decrease of La.

Figure 11:
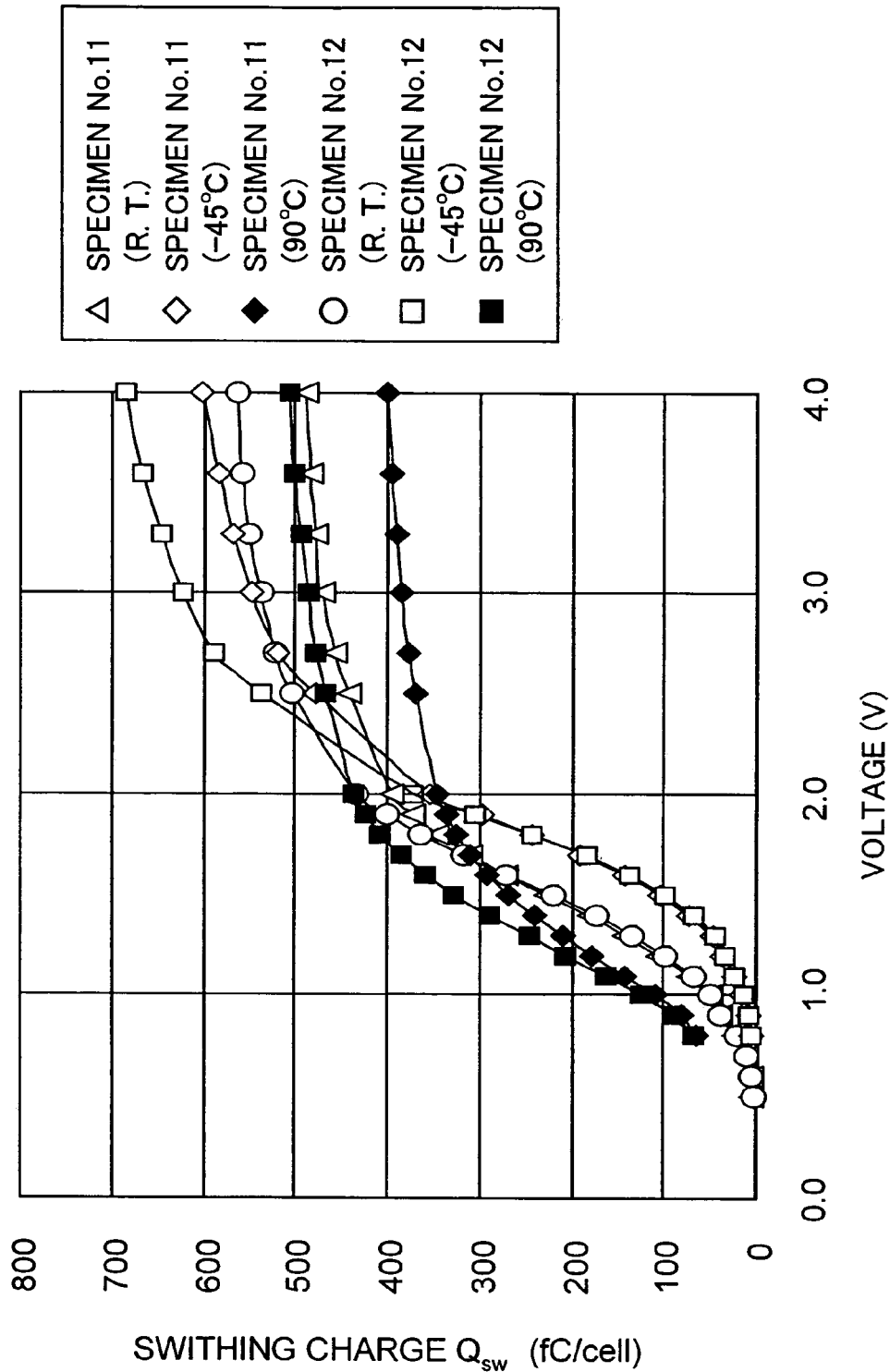
FIG. 11 shows a graph illustrating a relationship between an applied voltage and a switching charge $Q_{SW}$.

FIG. 11 shows a graph illustrating a relationship of the applied voltages to the switching charge $Q_{SW}$ in the memory cell array. The measurement of polarization was performed at room temperature (24° C.) −45° C. and 90° C.

In regard to the switching charge $Q_{SW}$ obtained in the measurement at −45° C., there was substantially no difference between the specimen No. 11 and the specimen No. 12 under an applied voltage of 1.8 V or lower. In contrast, when the applied voltage came to 1.9 V or higher, the switching charge $Q_{SW}$ was increased more remarkably in the specimen No. 12. Also, in regard to the switching charge $Q_{SW}$ obtained in the measurement at room temperature, at an applied voltage of 1.7 V or higher, the switching charge $Q_{SW}$ were increased more remarkably in the specimen No. 12. Further, in regard to the switching charge $Q_{SW}$ obtained in the measurement at 90° C., at an applied voltage of 1.0 V or higher, the switching charge $Q_{SW}$ was increased more remarkably in the specimen No. 12. As such, in each measurement temperature, the switching charge $Q_{SW}$ in the specimen No. 12 was larger than in the specimen No. 11. The reason is that the content La is smaller in the specimen No. 12.

Figure 12:
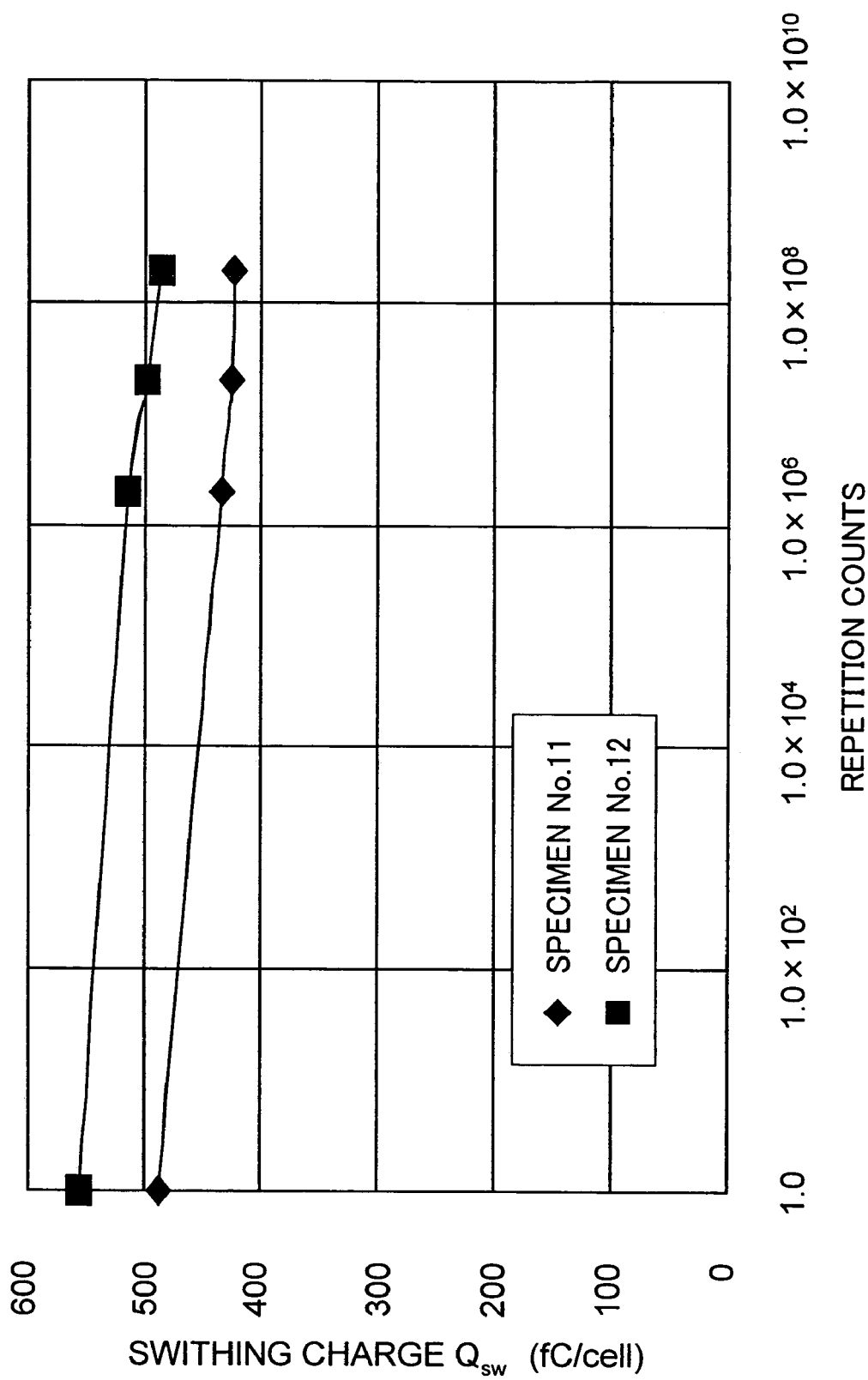
FIG. 12 shows a graph illustrating an examination result of a fatigue loss.

In FIG. 12, examination results with respect to the fatigue loss of the memory cell array are shown. In the examination, a readout voltage was set at 3 V, a stress voltage was set at 7 V, and applications of voltage were repeated for 2.0×10$^8$ times.

A reduction rate (fatigue loss) of the switching charge $Q_{SW}$ to the initial value in the specimen No. 12 was 12.86%. In contrast, the reduction rate (fatigue loss) of the switching charge $Q_{SW}$ to the initial value in the specimen No. 11 was 13.56%. In case of decreasing the La content, there is a probability of an increase in the fatigue loss. However, in the specimen No. 12, such the fatigue loss increase was not produced because Nb was included.

Figure 13:
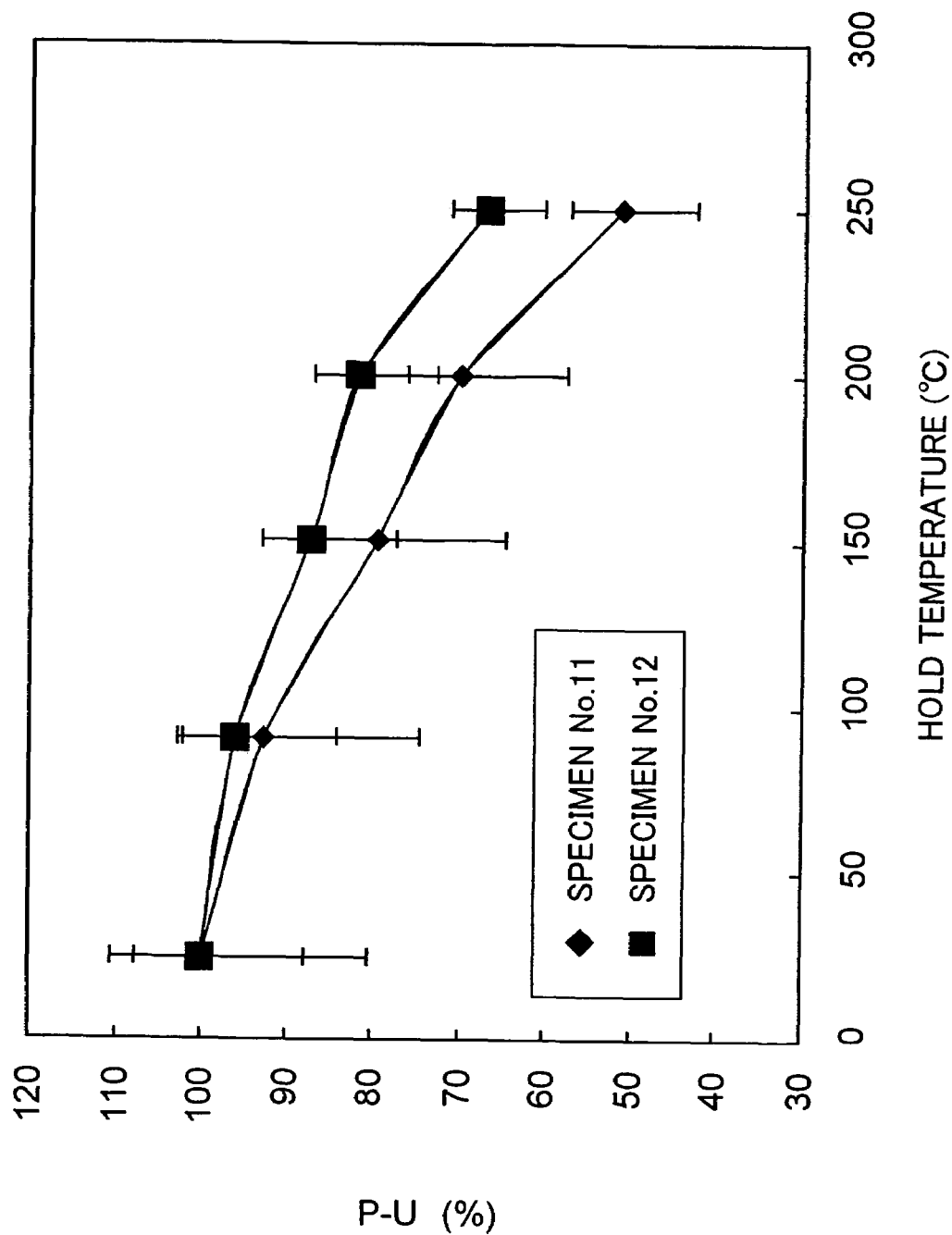
FIG. 13 shows a graph illustrating an examination result of a thermal depolarization.

In FIG. 13, examination results in regard to the thermal depolarization in the memory cell array were shown. In the examination, writing was performed at room temperature, and when readout was performed at room temperature after being left intact under a variety of temperatures for one hour, the difference between the values P and U was obtained. Let a value (P−U) obtained when reading out after left intact at room temperature be 100%, in the case of readout after left at 250° C., the value (P−U) was reduced to the order of 50% in the specimen No. 11, whereas the value (P−U) as high as 70% or of that order was obtained in the specimen No. 12. In other words, the degree of thermal depolarization was suppressed lower in the specimen No. 12. The reason is considered that the Curie temperature of the specimen No. 12 is as high as about 360° C., in contrast to the Curie temperature of the specimen No. 11 of about 340° C.

Figure 14A:
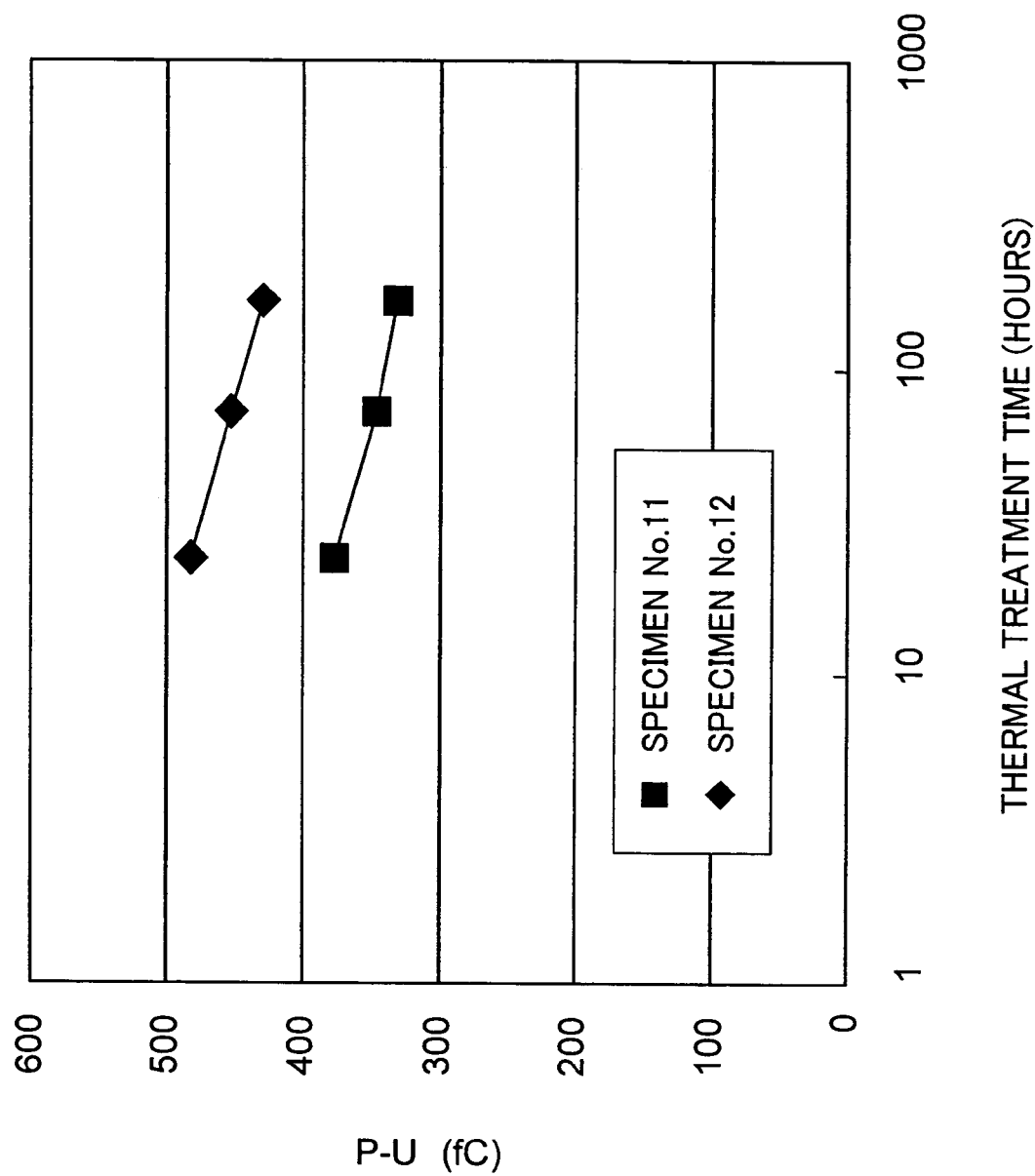
FIG. 14A shows a graph illustrating a relationship between a heat treatment time and a value (P–U).

In FIGS. 14A and 14B, examination results on an imprint characteristic of the memory cell array are shown. In FIG. 14A, the relationship between a heat treatment time and the value (P−U) is shown, while in FIG. 14B, an OS_RATE is shown. Here, in FIGS. 14A and 14B, the worst results of each specimen are shown. The greater the value (P−U) is, the greater the margin in the device becomes. Also, the smaller the absolute value of the OS_RATE is, the more hardly the imprint occurs. As shown in FIGS. 14A and 14B, there were obtained the results that, in the specimen No. 12, the imprint is harder to occur, and a larger margin is secured, than in the specimen No. 11.

As such, as compared with the specimen No. 11, it is possible to obtain a higher switching charge $Q_{SW}$ by the specimen No. 12, in which the thermal depolarization and the imprint were hard to occur. Also, the specimen No. 12 produces a higher margin after the fatigue, and is endurable for use in a severer environment.

It should be noted that, although a planar-type ferroelectric capacitor has been manufactured in the aforementioned embodiment, it may also be possible to apply the present invention to a stack-type ferroelectric capacitor. In this case, a portion of a contact plug such as a W plug connected to a transistor such as a MOSFET is connected to the bottom electrode of the ferroelectric capacitor. Also, when adopting the stack-type, high-temperature integrated etching may be performed.

Also, a crystal structure of the substance constituting the ferroelectric film is not limited to the perovskite structure, but a bismuth layer structured ferroelectrics may be applicable, for example. Further, the composition of the substance constituting the ferroelectric film is not particularly limited. For example, in the A-site, Pb (lead), Sr (strontium), Ca (calcium), Bi (bismuth), Ba (barium), Li (lithium) and/or Y (yttrium) may be included. Also, in the B-site, Ti (titan), Zr (zirconium), Hf (hafnium), V (vanadium), Ta tantalum), W (tungsten), Mn (manganese), Al (aluminum), Bi (bismuth) and/or Sr (strontium) may be included.

As chemical formulae of the substances constituting the ferroelectric film, for example, $Pb(Zr,Ti)O_3$, $(Pb,Ca)(Zr,Ti)O_3$, $(Pb,Ca)(Zr,Ti,Ta)O_3$, $(Pb,Ca)(Zr,Ti,W)O_3$, $(Pb,Sr)(Zr,Ti)O_3$, $(Pb,Sr)(Zr,Ti,W)O_3$, $(Pb,Sr)(Zr,Ti,Ta)O_3$, $(Pb,Ca,Sr)(Zr,Ti)O_3$, $(Pb,Ca,Sr)(Zr,Ti,W)O_3$, $(Pb,Ca,Sr)(Zr,Ti,Ta)O_3$, $SrBi_2Ta_2O_9$, $Bi_4Ti_3O_9$, and $BaBi_2Ta_2O_9$ may be listed, though it is not limited thereto. Also, Si may be added to the above substances.

Also, the compositions of the top electrode and the bottom electrode are not limited particularly. The bottom electrode may be configured of, for example, Pt (platinum), Ir (iridium), Ru (ruthenium), Rh (rhodium), Re (rhenuim), Os (osmium) and/or Pd (palladium). It may also be possible to be configured of the oxides thereof. The top electrode may be configured of the oxides of Pt, Ir, Ru, Rh, Re, Os and/or Pd. Further, the top electrode may be configured of a lamination of a plurality of films.

Further, the structure of the ferroelectric memory cell is not limited to 1T1C type, but 2T2C type may be possible. Also, in the ferroelectric memory, the ferroelectric capacitor itself may constitute both a memory portion and a switching portion in common. In this case, the structure may be such that the ferroelectric capacitor is formed in place of the gate electrode of a MOS transistor. Namely, a ferroelectric capacitor is formed on a semiconductor substrate by the intermediary of a gate insulating film.

Also, a ferroelectric capacitor may be provided in a logic circuit or the like. In this case, a DRAM having above-described ferroelectric capacitor may be configured.

Further, there is no particular restriction on the method for forming the ferroelectric film. For example, a sol-gel method, a metal organic deposition (MOD) method, a CSD (chemical solution deposition) method, a chemical vapor deposition (CVD) method, an epitaxial growth method, a sputtering method, an MOCVD (metal organic chemical vapor deposition) method, or the like may be adopted.

INDUSTRIAL APPLICABILITY

As described above in detail, according to the present invention, it is possible to improve the crystallinity of a ferroelectric film while obtaining better uniformity. As a result, the characteristic of the ferroelectric capacitor can be improved.

What is claimed is:

1. A semiconductor device comprising:
   a semiconductor substrate; and
   a ferroelectric capacitor comprising:
      a ferroelectric film formed over said semiconductor substrate, said ferroelectric film being constituted of a substance of which chemical formula is expressed by $ABO_3$, added with La and Nb;
      a first top electrode film formed on said ferroelectric film, said first top electrode film including an oxide of Ir, and
      a second top electrode film formed on said first top electrode film, said second top electrode film including Ir,
      wherein an oxygen composition of said first top electrode film is smaller than that of said second top electrode film.

2. The semiconductor device according to claim 1, wherein a content of La in said ferroelectric film is 0.1 to 5 mol %.

3. The semiconductor device according to claim 1, wherein a content of Nb in said ferroelectric film is 0.1 to 5 mol %.

4. The semiconductor device according to claim 1, herein a content of La is 0.1 to 5 mol % and a content of Nb is 0.1 to 5 mol % in said ferroelectric film.

5. The semiconductor device according to claim 1, wherein a crystal structure of said substance constituting said ferroelectric film is either a perovskite structure or a bismuth layer structured ferroelectrics.

6. The semiconductor device according to claim 1, wherein said substance constituting said ferroelectric film includes at least one kind of elements selected from the group consisting of Pb, Sr, Ca, Bi, Ba, Li and Y, in the A-site.

7. The semiconductor device according to claim 1, said substance constituting said ferroelectric film includes at least one kind of elements selected from the group consisting of Ti, Zr, Hf, V, Ta, W, Mn, Al, Bi and Sr, in the B-site.

8. The semiconductor device according to claim 1, wherein a chemical formula of said substance constituting said ferroelectric film is expressed by one kind selected from the group consisting of:
   $Pb(Zr,Ti)O_3$,
   $(Pb,Ca)(Zr,Ti)O_3$,
   $(Pb,Ca)(Zr,Ti,Ta)O_3$,
   $(Pb,Ca)(Zr,Ti,W)O_3$,
   $(Pb,Sr)(Zr,Ti)O_3$,
   $(Pb,Sr)(Zr,Ti,W)O_3$,
   $(Pb,Sr)(Zr,Ti,Ta)O_3$,
   $(Pb,Ca,Sr)(Zr,Ti)O_3$,
   $(Pb,Ca,Sr)(Zr,Ti,W)O_3$,
   $(Pb,Ca,Sr)(Zr,Ti,Ta)O_3$,
   $SrBi_2Ta_2O_9$,
   $Bi_4Ti_3O_9$, and
   $BaBi_2Ta_2O_9$.

9. The semiconductor device according to claim 8, wherein Si is further added to said substance constituting said ferroelectric film.

10. The semiconductor device according to claim 1, wherein said ferroelectric capacitor comprises a bottom electrode including at least one kind of elements selected from the group consisting of Pt, Ir, Ru, Rh, Re, Os and Pd.

11. The semiconductor device according to claim 1, wherein said ferroelectric capacitor comprises a bottom electrode including an oxide of at least one kind of elements selected from the group consisting of Pt, Ir, Ru, Rh, Re, Os and Pd.

12. The semiconductor device according to claim 1, further comprising a memory cell array having said ferroelectric capacitors in a plurality of numbers.

13. The semiconductor device according to claim 12, wherein each memory cell constituting said memory cell array comprises:
    said ferroelectric capacitor as a memory portion; and
    a transistor connected to said ferroelectric capacitor as a switching portion.

14. The semiconductor device according to claim 12, wherein each memory cell constituting said memory cell array comprises said ferroelectric capacitor as a memory portion and a switching portion.

15. The semiconductor device according to claim 1, wherein the composition of the second top electrode film is off the stoichiometric composition of the oxide of Ir.

16. A manufacturing method of a semiconductor device comprising the step of:
    forming a ferroelectric capacitor above a semiconductor substrate, said ferroelectric capacitor comprising a ferroelectric film, a first top electrode film formed on said ferroelectric film, said first top electrode film including an oxide of Ir, and a second top electrode film formed on said first top electrode film, said second top electrode film including Ir,
    wherein said ferroelectric film is constituted of a substance of which chemical formula is expressed by $ABO_3$, added with La and Nb,
    wherein an oxygen composition of said first top electrode film is smaller than that of said second top electrode film.

17. The manufacturing method of a semiconductor device according to claim 16, wherein a content of La in said ferroelectric film is set at 0.1 to 5 mol %.

18. The manufacturing method of a semiconductor device according to claim 16, wherein a content of Nb in said ferroelectric film is set at 0.1 to 5 mol %.

19. The manufacturing method of a semiconductor device according to claim 16, wherein a content of La is set at 0.1 to 5 mol %, and a content of Nb is set at 0.1 to 5 mol % in said ferroelectric film.

20. The manufacturing method of a semiconductor device according to claim 16, wherein the composition of the second top electrode film is off the stoichiometric composition of the oxide of Ir.

* * * * *